(12) United States Patent
Nakatsuka et al.

(10) Patent No.: US 7,554,422 B2
(45) Date of Patent: Jun. 30, 2009

(54) FILTER MODULE USING PIEZOELECTRIC RESONATORS, DUPLEXER, COMMUNICATION DEVICE, AND METHOD FOR FABRICATING FILTER MODULE

(75) Inventors: Hiroshi Nakatsuka, Osaka (JP); Naohiro Tsurumi, Kyoto (JP); Kazuhiro Yahata, Osaka (JP)

(73) Assignee: Panasonic Corporation, Osaka (JP)

( * ) Notice: Subject to any disclaimer, the term of this patent is extended or adjusted under 35 U.S.C. 154(b) by 559 days.

(21) Appl. No.: 11/221,867

(22) Filed: Sep. 9, 2005

(65) Prior Publication Data

US 2006/0055486 A1 Mar. 16, 2006

(30) Foreign Application Priority Data

Sep. 10, 2004 (JP) ............................. 2004-264158

(51) Int. Cl.
*H03H 9/70* (2006.01)
(52) U.S. Cl. ...................... 333/133; 333/189
(58) Field of Classification Search ................. 333/133, 333/189
See application file for complete search history.

(56) References Cited

U.S. PATENT DOCUMENTS 5,231,327 A * 7/1993 Ketcham .................... 310/366
5,373,268 A 12/1994 Dworsky et al.
6,262,637 B1 * 7/2001 Bradley et al. .............. 333/133
6,972,641 B2 * 12/2005 Huynh ....................... 333/133
7,078,984 B2 * 7/2006 Komuro et al. ............. 333/133
7,138,888 B2 * 11/2006 Yamakawa et al. .......... 333/133

FOREIGN PATENT DOCUMENTS

| JP | 05-183380 | 7/1993 |
| JP | 09-064683 | 3/1997 |
| JP | 2800905 | 7/1998 |
| WO | WO 03073611 A1 * | 9/2003 |

* cited by examiner

*Primary Examiner*—Benny Lee
*Assistant Examiner*—Alan Wong
(74) *Attorney, Agent, or Firm*—McDermott Will & Emery LLP

(57) ABSTRACT

A filter module includes a substrate and a plurality of resonators formed on the substrate and utilizing longitudinal vibration along the thickness of a piezoelectric layer. A plurality of external connection terminals are formed above or below the piezoelectric layer so as to be electrically connected to external circuits and also electrically connected to some of the plurality of resonators through a plurality of interconnects formed to the side of the piezoelectric layer to which the external connection terminals are formed.

11 Claims, 20 Drawing Sheets

FILTER MODULE USING PIEZOELECTRIC RESONATORS, DUPLEXER, COMMUNICATION DEVICE, AND METHOD FOR FABRICATING FILTER MODULE

CROSS-REFERENCE TO RELATED APPLICATIONS

This application claims priority under 35 U.S.C. §119 on Patent Application No. 2004-264158 filed in Japan on Sep. 10, 2004, the entire contents of which are hereby incorporated by reference.

BACKGROUND OF THE INVENTION (1) Field of the Invention

The present invention relates to a filter using piezoelectric resonators, and more particularly relates to a filter module formed on a substrate used for a high-frequency circuit of a mobile communication terminal, such as a cellular phone or a wireless local access network (LAN).

(2) Description of Related Art

There have been demands for not only reduction in the size and weight of components built into mobile communication terminals, such as cellular phones or wireless LANs, but also an increase in the performance thereof. Therefore, high-performance and thin filters have been demanded. For the purpose of satisfying such demands, filters using piezoelectric resonators of a piezoelectric material have been suggested (see, for example, Japanese Patent No. 2800905 and U.S. Pat. No. 5,373,268). High-performance and thin filters may be able to be obtained by using, as such piezoelectric resonators, resonators utilizing longitudinal vibration along the thickness of the piezoelectric material, such as thin film bulk acoustic resonators (FBAR).

In order to reduce the sizes of such filters and increase the performance thereof, a plurality of piezoelectric resonators must be formed on one substrate. In order to provide filters that can be used at a high frequency, individual piezoelectric resonators need be improved in their characteristics, and, in addition, the arrangement of piezoelectric resonators, interconnects between piezoelectric resonators, and also connection between filters and external circuits need be optimized.

A technique in which a plurality of piezoelectric resonators are fabricated on one substrate is disclosed in Japanese Unexamined Patent Publication No. 9-64683. According to this publication, a plurality of piezoelectric resonators are formed on a single substrate or wafer and electrically connected through electrical connections patterned on the substrate or wafer, thereby reducing the size of a filter.

SUMMARY OF THE INVENTION

Although for a known filter it has been taken into account that a filter is to be reduced in size by forming a plurality of resonators on a substrate or wafer, connections between resonators and connections between a filter and external circuits have not been taken into account. Therefore, a known filter structure and a fabrication method for the same have the following problems. Three-dimensional interconnects passing through a piezoelectric layer need be formed by etching to connect upper electrodes with lower electrodes. Alternatively, three-dimensional complicated interconnects need be formed between a filter and external circuits by forming, both above and below the piezoelectric layer, external connection terminals, such as input/output terminals and ground terminals, for exchanging signals between the filter and the external circuits.

A fabrication process is thus complicated, leading to the increased production variations. This deteriorates the characteristics of resonators at a high frequency. Furthermore, a piezoelectric layer need be etched very precisely. However, part of a piezoelectric layer that is necessary for piezoelectric resonators may also be etched. Furthermore, an upper electrode of a piezoelectric resonator may become worse in its surface roughness, leading to the deteriorated resonance characteristics of the piezoelectric resonators.

With the aim of preventing the piezoelectric layer from being etched, the shape of a piezoelectric layer can be controlled using a mask to expose a part of a lower electrode. However, in this case, process steps become very complicated. In any case, three-dimensional interconnects are formed to have a step height corresponding to the thickness of the piezoelectric layer. Therefore, an increase in the thickness of the piezoelectric layer causes faulty electrical continuity or the like between patterned electrodes, leading to the increased resistance losses of resonators and also the deteriorated resonance characteristics thereof.

On the other hand, external connection terminals can be formed both above and below a piezoelectric layer. In this case, three-dimensional interconnects need be formed to connect a filter module to external circuits. Therefore, complicated interconnects must be formed when a filter module is to be embedded in a device. In a high-frequency circuit, slight differences among routings of interconnects may decrease the performance of the whole device.

The present invention has been made to solve the aforementioned problems, and an object of the present invention is to provide a high-performance and small filter in which no three-dimensional interconnect passing through a piezoelectric layer is included in a filter module and which is easily embedded in a device because of the existence of all external connection terminals in the same plane and uses piezoelectric resonators utilizing longitudinal vibration along the thickness of a piezoelectric material.

In order to achieve the above object, a filter module of the present invention is connected to external circuits above or below a piezoelectric layer.

More specifically, a filter module of the present invention includes: a substrate; a plurality of resonators formed on the substrate, having a piezoelectric layer supported on the substrate to spread over the principal surface of the substrate and utilizing longitudinal vibration along the thickness of the piezoelectric layer; a plurality of external connection terminals formed above or below the piezoelectric layer so as to be electrically connected to external circuits; and a plurality of first interconnects formed to the side of the piezoelectric layer to which the external connection terminals are formed to electrically connect the external connection terminals to associated ones of the plurality of resonators.

According to the filter module of the first aspect of the present invention, no three-dimensional interconnect needs to be formed to connect the external connection terminals to resonators. This eliminates the need for etching the piezoelectric layer to form three-dimensional interconnects. Therefore, the piezoelectric layer is not damaged due to etching. This can provide a filter without deteriorated characteristics in a high-frequency region. Furthermore, since interconnects in the filter module can be simplified, this can reduce the footprint of the filter module and also facilitate connecting the filter module to the external circuits.

It is preferable that the filter module of the present invention further includes a plurality of second interconnects through each of which, out of the plurality of resonators, the predetermined resonators are electrically connected to each other, wherein each said resonator comprises a pair of electrodes consisting of lower and upper electrodes formed on the back and top surfaces of the piezoelectric layer, respectively, each said first interconnect is electrically connected to one of the associated upper and lower electrodes formed on the surface of the piezoelectric layer on which the associated external connection terminal is formed, and each said second interconnect is used to electrically connect the associated pair of lower electrodes to each other or to electrically connect the associated pair of upper electrodes to each other.

With this structure, no three-dimensional interconnect needs to be formed in the filter module to pass through the piezoelectric layer. This eliminates the need for etching the piezoelectric layer to form three-dimensional interconnects. Therefore, the piezoelectric layer is not damaged due to etching. This can provide a filter without deteriorated characteristics in a high-frequency region. Furthermore, since interconnects in the filter module can be simplified, this can reduce the footprint of the filter module and also facilitate connecting the filter module to the external circuits.

In the filter module of the first aspect, a cavity is preferably formed under each said lower electrode. With this structure, piezoelectric resonators utilizing longitudinal vibration along the thickness of the piezoelectric layer can be certainly formed on the substrate.

It is preferable that an acoustic multilayer film is formed under each said lower electrode, the acoustic multilayer film is obtained by alternately stacking at least two first thin layers and at least two second thin layers having a higher acoustic impedance than the first thin layer, and the uppermost layer of the acoustic multilayer film is the first thin layer. Also with this structure, piezoelectric resonators utilizing longitudinal vibration along the thickness of the piezoelectric layer can be certainly formed on the substrate.

In the filter module of the first aspect, the plurality of external connection terminals may be formed above or below the piezoelectric layer. This structure facilitates connecting the external connection terminals to external circuits.

It is preferable that the filter module of the first aspect is a ladder filter, the external connection terminals include two input/output terminals through which signals are input/output to/from the filter module, at least one resonator unit is connected between the input/output terminals, and the resonator unit includes a serial element including some of the plurality of resonators electrically connected in series between the input/output terminals and at least one parallel element including some of the plurality of resonators electrically connected between the input/output terminals and the ground.

It is preferable that in the filter module of the first aspect, the serial element represents first and second resonators electrically connected in series to each other, the parallel element is connected between at least one of both ends of the serial element and a node at which the first and second resonators are connected to each other and the ground, the parallel element connected to the node represents a third resonator, and the parallel element connected to at least one of the both ends of the serial element represents fourth and fifth resonators connected in series to the input/output terminals. This structure can simplify interconnects in the filter module. As a result, a high-performance filter can be certainly achieved.

The parallel element connected to at least one of the both ends of the serial element may include one or more sixth resonators connected in parallel to the fifth resonator. The parallel element connected to at least one of the both ends of the serial element may include one or more capacitor elements connected in parallel to the fifth resonator. In this case, the capacitor elements are preferably formed using predetermined regions of the piezoelectric layer as capacitive insulating films.

In the filter module of the first aspect, the piezoelectric layer preferably represents a film formed on a film formation substrate and bonded onto the substrate. With this structure, a low-loss and broadband filter module can be certainly achieved which includes a high-quality piezoelectric layer having a high quality factor and a high coupling coefficient.

A duplexer of the present invention includes a first filter, a second filter and a phase-shift circuit, wherein the first and second filters each include the filter module of the present invention.

Since the duplexer of the present invention uses the filter module of the present invention, this can simplify the interconnect pattern. As a result, a high-performance and small duplexer can be obtained.

A communication device of a first aspect of the present invention includes the filter module of the present invention. Since the communication device of the first aspect uses the filter module of the present invention, this can simplify the interconnect pattern. As a result, a high-performance and small duplexer can be obtained.

A communication device of a second aspect of the present invention includes the duplexer of the present invention. Since the communication device of the second aspect uses the duplexer of the present invention, this can simplify the interconnect pattern. As a result, a high-performance and small duplexer can be obtained.

A method for fabricating a filter module including a plurality of resonators formed on a substrate according to a first aspect of the present invention includes the steps of: forming a piezoelectric layer on a first substrate; forming a plurality of lower electrodes on the piezoelectric layer; forming upper electrodes on regions of the piezoelectric layer opposed to the lower electrodes, respectively, with the piezoelectric layer interposed between the upper electrodes and the lower electrodes; forming, on a second substrate, holding structures each having a plurality of recesses; bonding the first substrate and the second substrate to each other while opposing the piezoelectric layer on which the plurality of lower electrodes are formed to the holding structures formed with the plurality of recesses, thereby forming a bonded structure in which cavities are formed under the plurality of lower electrodes, respectively; after the formation of the bonded structure, separating the first substrate from the piezoelectric layer; forming a plurality of external connection terminals connected to external circuits above or below the piezoelectric layer; forming a plurality of first interconnects through which the external connection terminals are electrically connected to some of the plurality of resonators; and forming at least one second interconnect through which predetermined two of the plurality of resonators are electrically connected to each other, wherein the first interconnects are electrically connected to the lower or upper electrodes formed on the surface of the piezoelectric layer on which the external connection terminals are formed, and the lower or upper electrodes are connected through the second interconnect.

According to the method of the first aspect, the piezoelectric layer does not need to be etched to form a filter module. This prevents the piezoelectric layer from being deteriorated due to etching. Furthermore, since cavities can be easily and accurately formed, the resonators formed on the substrate can have the same characteristics. This facilitates providing a high-performance filter. Moreover, since a plurality of external connection terminals are formed above or below the piezoelectric layer to connect the filter module to external circuits, this eliminates the need for three-dimensionally routing interconnects in the connections between the filter module and external circuits. As a result, a filter can be obtained which is less likely to have deteriorated high-frequency characteristics.

In the method of the first aspect, the upper electrodes are preferably formed after the separation of the first substrate from the piezoelectric layer.

In the step of forming the bonded structure of the method of the first aspect, the first substrate is preferably bonded to the second substrate by eutectic bonding.

It is preferable that the method of the first aspect further includes, before the step of forming the bonded structure, at least one of the step of forming a first adhesive layer on the lower electrodes and the step of forming a second adhesive layer on the holding structure. With this structure, the piezoelectric layer can be certainly bonded to the holding structure. In this case, the first and second adhesive layers are preferably made of gold or an alloy containing gold.

A method for fabricating a filter module including a plurality of resonators formed on a substrate according to a second aspect of the present invention includes the steps of: forming a plurality of recesses in the top surface of the substrate; filling the recesses with sacrificial layers; forming lower electrodes on regions of the substrate in which the sacrificial layers are formed, respectively; entirely forming a piezoelectric layer over the substrate on which the lower electrodes are formed; removing the sacrificial layers to form cavities under the lower electrodes; forming upper electrodes on regions of the piezoelectric layer opposed to the lower electrodes, respectively, with the piezoelectric layer interposed between the upper electrodes and the lower electrodes; forming a plurality of external connection terminals connected to external circuits above or below the piezoelectric layer; forming a plurality of first interconnects through which the external connection terminals are electrically connected to some of the plurality of resonators; and forming at least one second interconnect through which predetermined two of the plurality of resonators are electrically connected, wherein the first interconnects are electrically connected to the lower or upper electrodes formed on the surface of the piezoelectric layer on which the external connection terminals are formed, and the lower or upper electrodes are connected through the second interconnect.

According to the method of the second aspect, all the external connection terminals can be formed on the same surface of the piezoelectric layer without forming any three-dimensional interconnect by etching the piezoelectric layer. Therefore, the piezoelectric layer is not damaged due to etching. As a result, a high-performance and small filter unit can be easily obtained.

BRIEF DESCRIPTION OF THE DRAWINGS

FIGS. 3A and 3B are cross-sectional views showing the filter module according to the first embodiment of the present invention, in which FIG. 3A is a cross-sectional view taken along the line IIIa-IIIa in FIG. 2 and FIG. 3B is a cross-sectional view taken along the line IIIb-IIIb in FIG. 2.

FIGS. 6A and 6B are cross-sectional views showing the still another filter module according to the first embodiment of the present invention, in which FIG. 6A is a cross-sectional view taken along the line VIa-VIa in FIG. 5 and FIG. 6B is a cross-sectional view taken along the line VIb-VIb in FIG. 5.

DETAILED DESCRIPTION OF THE INVENTION

Embodiment 1

Figure 1:
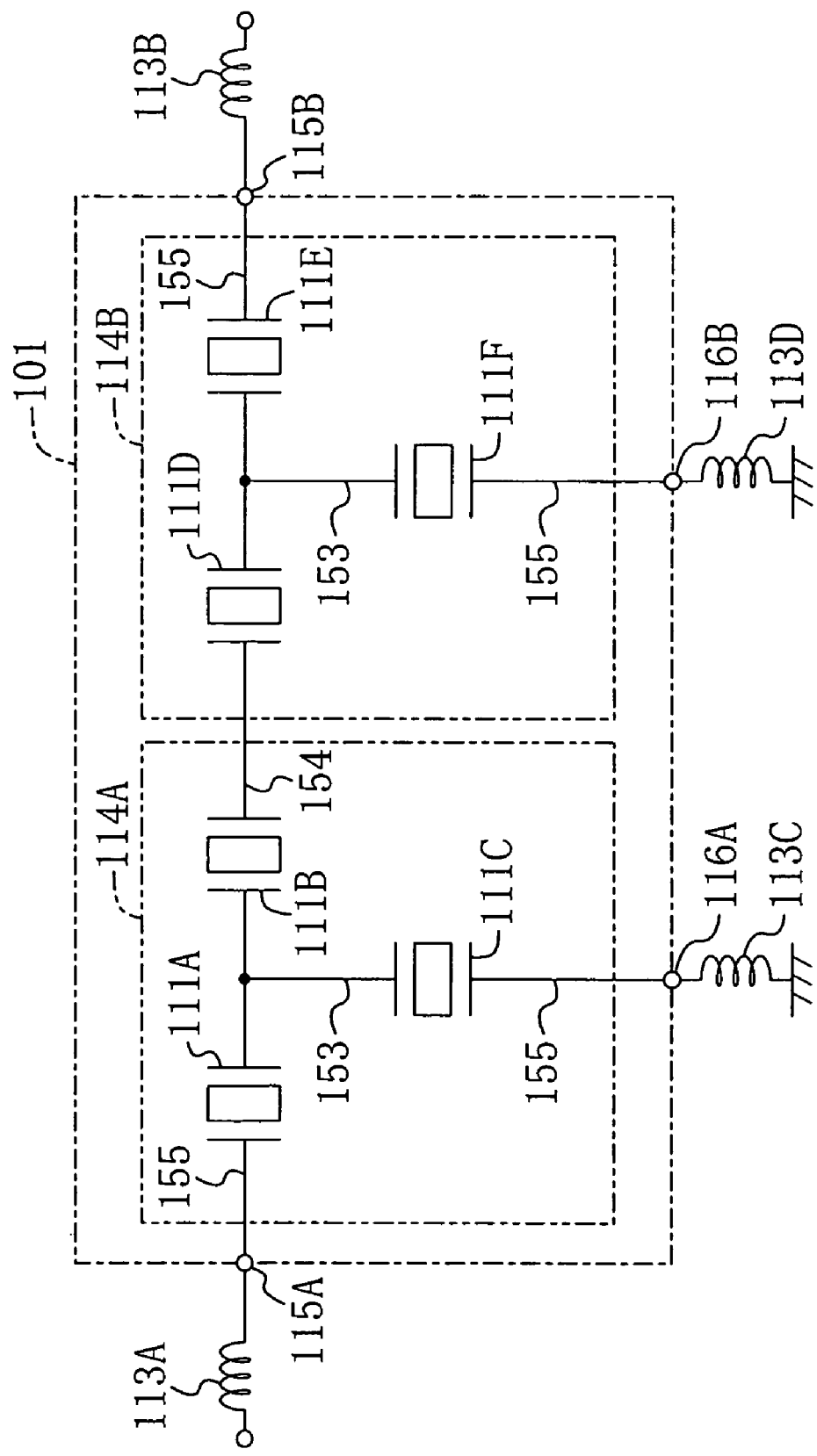
FIG. 1 is a circuit diagram showing a filter module according to a first embodiment of the present invention.

FIG. 1 is a circuit diagram showing a filter using a filter module according to a first embodiment of the present invention. As shown in FIG. 1, a filter is formed in the following manner. Inductors 113A and 113B are connected to input/output terminals 115A and 115B of a filter module including six resonators, respectively, and ground terminals 116A and 116B are grounded through inductors 113C and 113D, respectively.

A filter module 101 is formed such that units 114A and 114B of resonators in each of which three resonators are connected in a T shape are connected in series to each other. Out of resonators forming the unit 114A, a resonator 111C is connected at one end to the ground terminal 116A, then grounded through the inductor 113C and thus forms a parallel element connected in parallel to the input/output terminals 115A and 115B. Out of the resonators, resonators 111A and 111B form a serial element connected in series to the input/output terminals 115A and 115B. Likewise, in the unit 114B, resonators 111D and 111E form a serial element, and a resonator 111F forms a parallel element.

Figure 2:
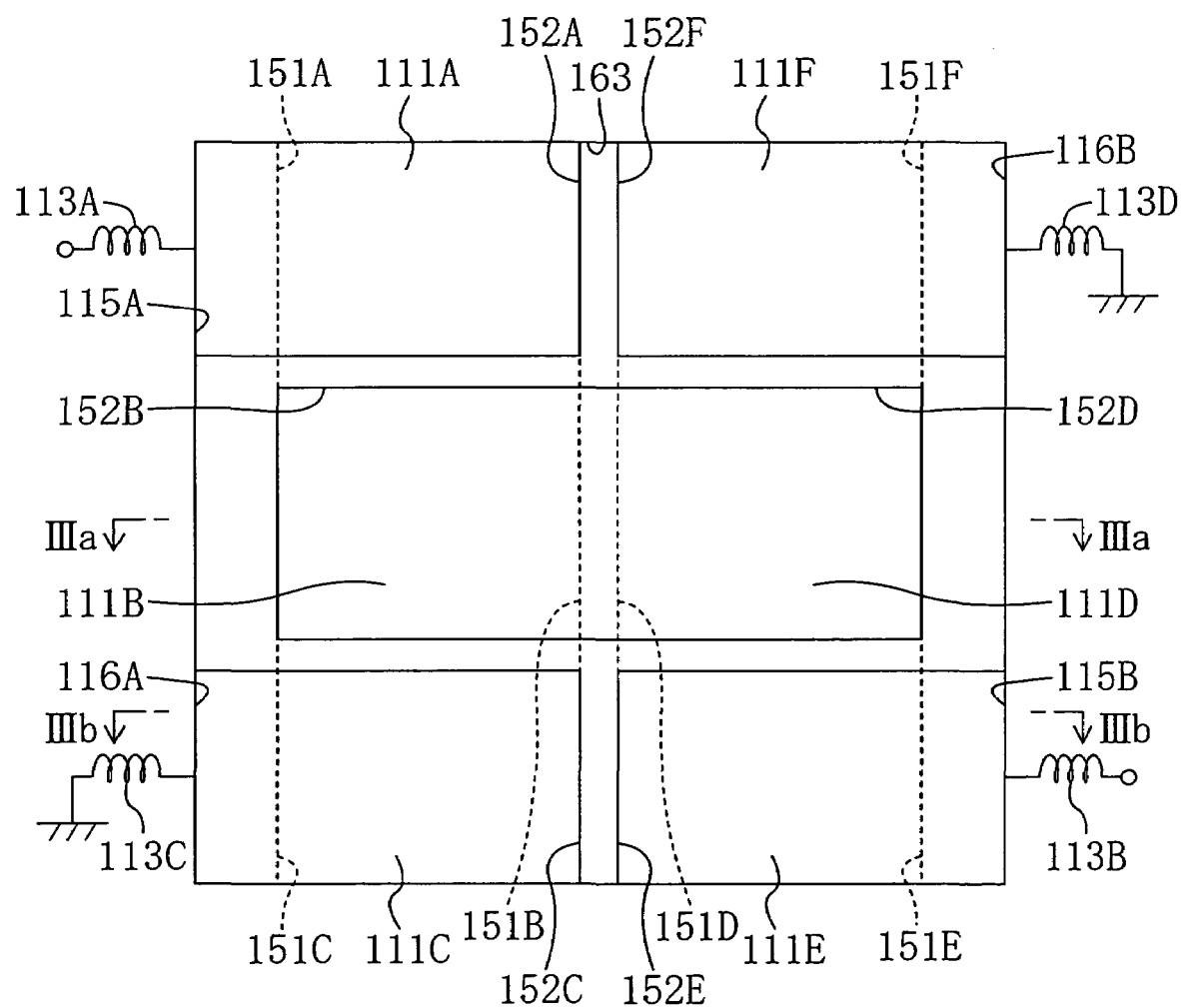
FIG. 2 is a top view showing the plan structure of the filter module according to the first embodiment of the present invention.
Figure 3A:
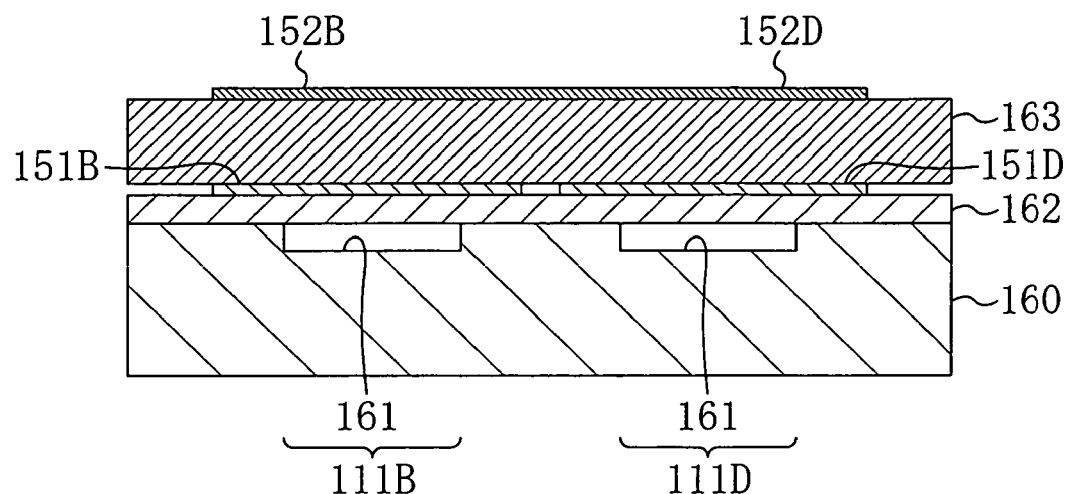
Figure 3B:
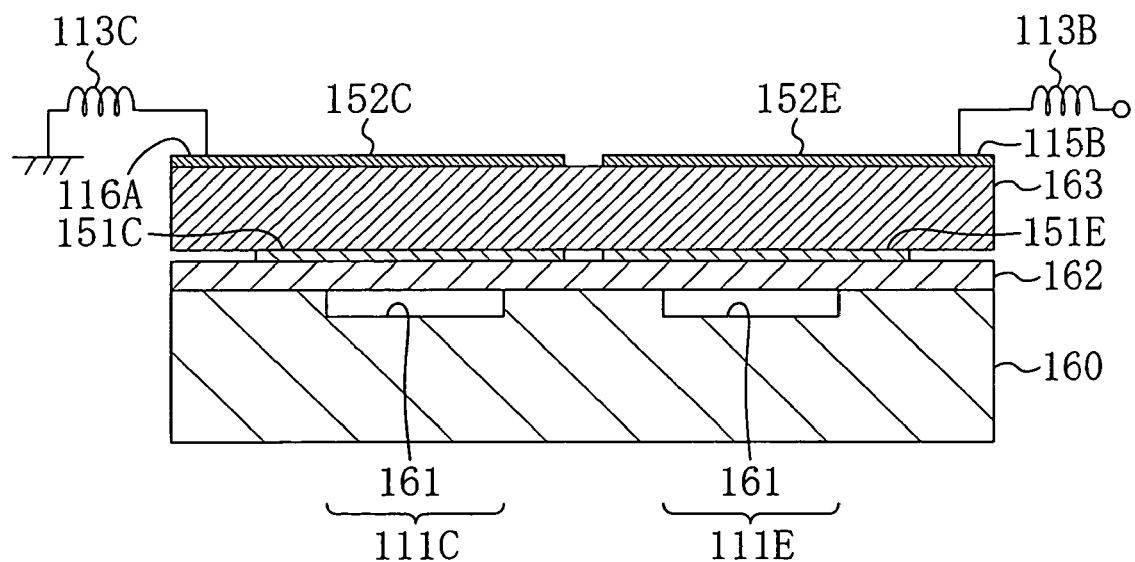

FIG. 2 shows an example of the plan structure of the filter module shown in the circuit diagram of FIG. 1. FIGS. 3A and 3B show cross-sectional structures of the filter module shown in FIG. 2, in which FIG. 3A shows a cross section of the filter module taken along the line IIIa-IIIa in FIG. 2 and FIG. 3B shows a cross section thereof taken along the line IIIb-IIIb in FIG. 2.

As shown in FIGS. 2, 3A and 3B, six resonators, i.e., resonators 111A, 111B and 111C forming a unit 114A and resonators 111D, 111E and 111F forming a unit 114B, are formed on a substrate 160.

The resonators have substantially the same cross-sectional structure. For example, as shown in the left part of FIG. 3B, in the resonator 111C, an insulating layer 162 of silicon dioxide ($SiO_2$) is deposited on the substrate 160 of silicon formed with a cavity 161. A lower electrode 151C of molybdenum (Mo) is formed on a region of the insulating layer 162 opposed to the cavity 161, and a piezoelectric layer 163 of aluminum nitride (AlN) is formed on the lower electrode 151C. Furthermore, an upper electrode 152C is formed on a region of the piezoelectric layer 163 opposed to the lower electrode 151C. Each of the insulating layer 162 and the piezoelectric layer 163 is formed continuously and shared by all the resonators.

Out of the six resonators formed on the substrate 160, the resonators 111A, 111B and 111C forming the unit 114A are electrically connected at their lower electrodes 151A, 151B and 151C through interconnects 153. Furthermore, the other resonators 111D, 111E and 111F forming the unit 114B are electrically connected at their lower electrodes 151D, 151E and 151F through interconnects 153. Moreover, the resonators 111B and 111D are electrically connected at their upper electrodes 152B and 152D through an interconnect 154 to each other, and thus the units 114A and 114B are connected in series to each other. In this embodiment, the interconnects are formed continuously with the associated electrodes.

In this way, resonators located in a filter module are connected at their upper or lower electrodes. Therefore, no three-dimensional interconnect is formed which passes through a piezoelectric layer to connect the upper electrodes to the lower electrodes.

In the filter module of this embodiment, the input/output terminals 115A and 115B and the ground terminals 116A and 116B are formed as external connection terminals through which the filter module is connected to external circuits. These external connection terminals are all formed on the top surface of the piezoelectric layer 163.

Furthermore, the input/output terminals 115A and 115B are electrically connected through interconnects 155 to the upper electrodes 152A and 152E of the resonators 111A and 111E, respectively. The ground terminals 116A and 116B are electrically connected through interconnects 155 to the upper electrodes 152C and 152F of the resonators 111C and 111F, respectively. Therefore, all the interconnects through which the external connection terminals are connected to the resonators are also planar, and no three-dimensional interconnect is formed.

In this embodiment, the input/output terminals 115A and 115B and the ground terminals 116A and 116B are formed continuously with the upper electrodes 152A, 152E, 152C, and 152F, respectively.

As described above, a filter module of this embodiment is formed without any three-dimensional interconnect passing through the piezoelectric layer. Therefore, the piezoelectric layer need not be etched to form three-dimensional interconnects. This can prevent the piezoelectric layer from being deteriorated due to etching. Furthermore, external connection terminals are all formed on the top surface of the piezoelectric layer, and the external connection terminals are all in the same plane. This eliminates the need for effecting a three-dimensional interconnection even when the filter module is embedded into a device, and can prevent high-frequency characteristics from being deteriorated in embedding the filter module into a device. Moreover, since the structure of a device can be simplified, this can reduce the size of the device and increase the performance thereof.

Figure 4:
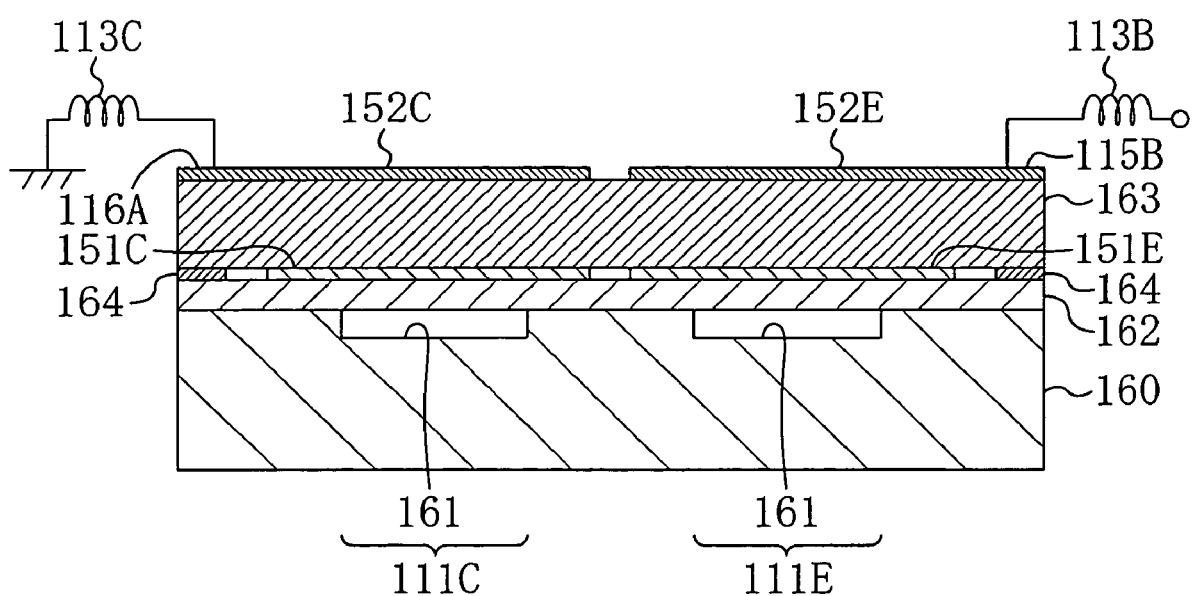
FIG. 4 is a cross-sectional view showing another filter module according to the first embodiment of the present invention.

Although in this embodiment supporting members are not formed under the external connection terminals, supporting members 164 may be formed immediately below the input/output terminals 115A and 115B and the ground terminals 116A and 116B as shown in FIG. 4. In this case, since regions of the filter module in which external connection terminals are formed are supported from below, this increases the strength of terminals and improves the reliability of a filter module.

In this case, an insulating material may be used for supporting members 164. Alternatively, the same material as that of lower electrodes may be used therefor. When the same material as that of lower electrodes is used therefor, the supporting members can be formed continuously with the lower electrodes in the step of forming lower electrodes. This can simplify a filter module fabrication process. Furthermore, if the supporting members are formed as capacitor elements, impedance matching between a filter and external circuits can be accomplished. When floating supporting members are formed, this can reduce the influence of stray capacitances.

Although in this embodiment external connection terminals are formed on the top surface of the piezoelectric layer, external connection terminals can be formed below the piezoelectric layer.

Figure 5:
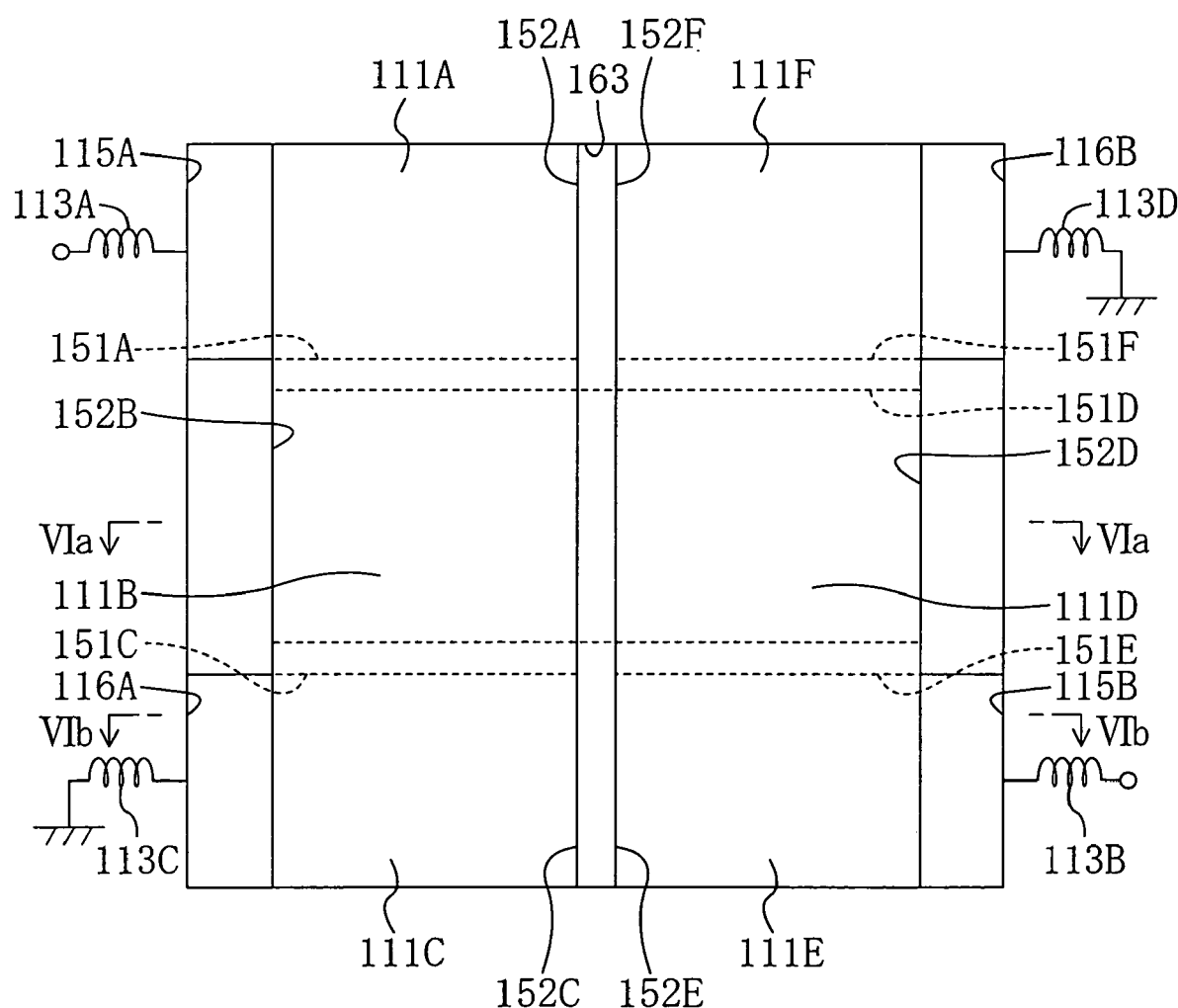
FIG. 5 is a top view showing still another filter module according to the first embodiment of the present invention.
Figure 6A:
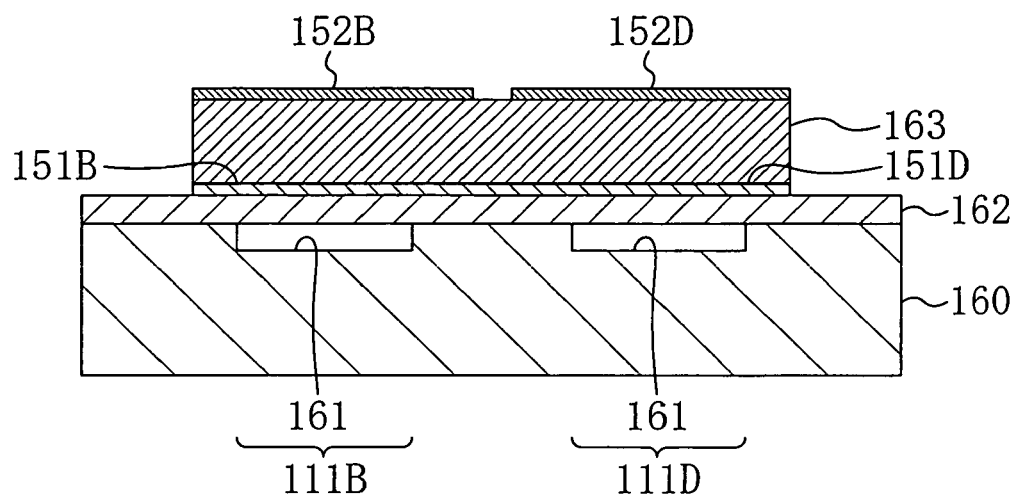
Figure 6B:
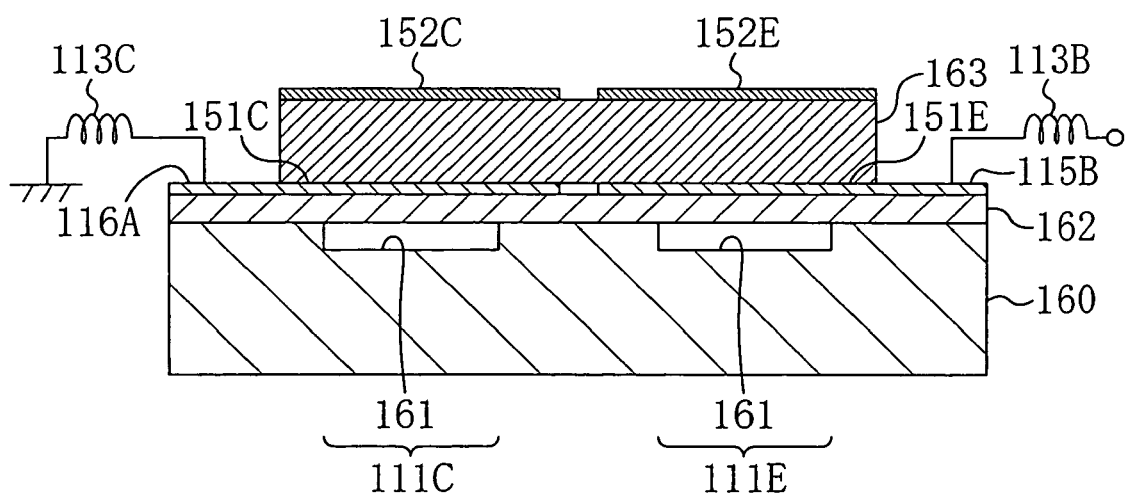

FIG. 5 shows another example of the plan structure of a filter module having a circuit configuration shown in FIG. 1. FIGS. 6A and 6B show another example of a cross-sectional structure of the filter module having the circuit configuration shown in FIG. 1, in which FIG. 6A shows a cross section taken along the line VIa-VIa in FIG. 5 and FIG. 6B shows a cross section taken along the line VIb-VIb in FIG. 5.

As shown in FIGS. 5 and 6, also when external connection terminals are connected to, instead of upper electrodes, lower electrodes, no three-dimensional interconnect need be formed by etching a piezoelectric layer. Furthermore, since external connection terminals can be formed below the piezoelectric layer, the external connection terminals can be supported by a substrate. This increases the strength of connection terminals and can thus provide high reliability.

Although in this embodiment two units each obtained by combining piezoelectric resonators are connected in series to each other, the number of units may be one. Alternatively, three or more units may be connected in series.

Although in this embodiment units each obtained by combining three piezoelectric resonators to have a T shape are used, various units obtained by combining piezoelectric resonators as shown in FIGS. 7A through 7E can be used. Furthermore, these units can be arbitrarily combined.

Figure 7A:
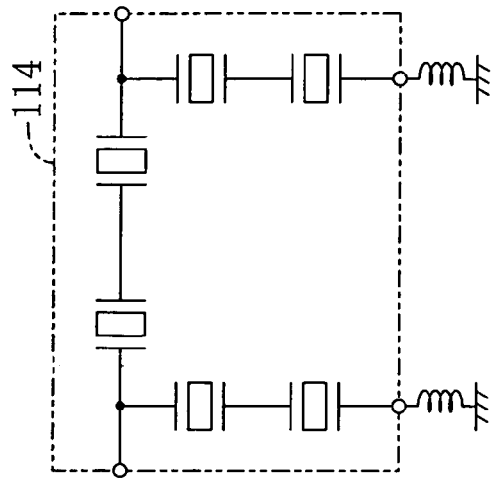
FIGS. 7A through 7F are circuit diagrams showing examples of units of resonators according to the first embodiment of the present invention.
Figure 7B:
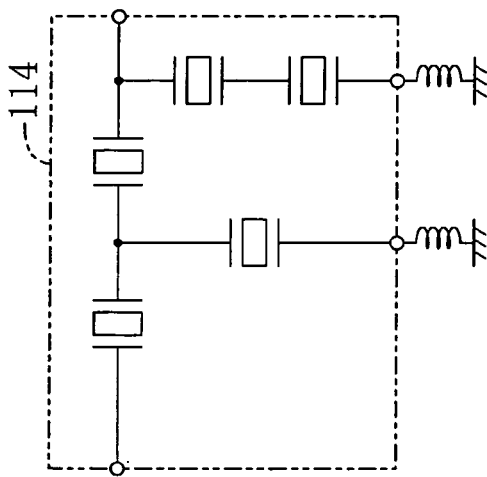
Figure 7C:
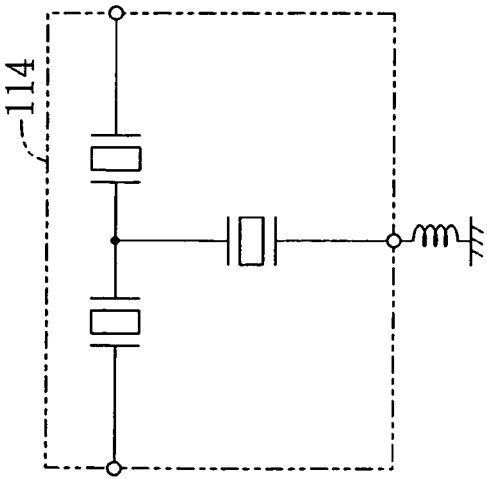
Figure 7D:
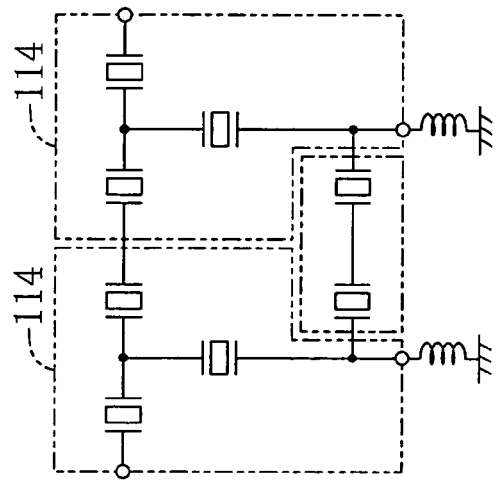
Figure 7E:
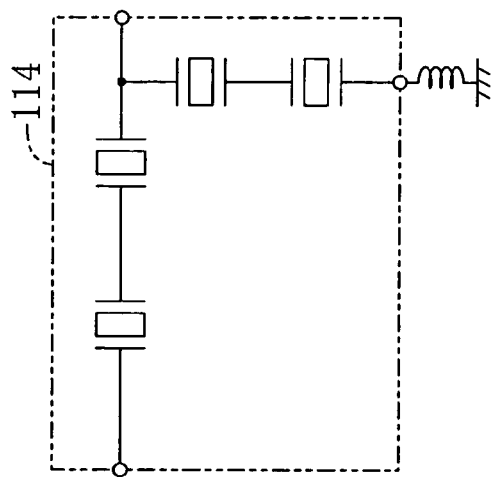
Figure 7F:
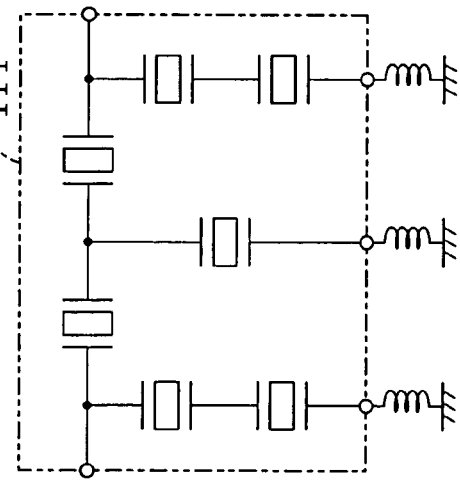

In the combination of filter units, two resonators may be connected in series between respective terminals of parallel elements located to the ground side, for example, as shown in FIG. 7F. This structure permits the setting of an out-of-band attenuation pole and can improve the filter characteristics not only in a passband but also outside the passband.

Although in this embodiment inductors are provided as components of a filter, inductors need not necessarily be placed at nodes between a filter module and external circuits. Furthermore, a single inductor can be shared by a plurality of parallel elements.

Embodiment 2

Figure 8:
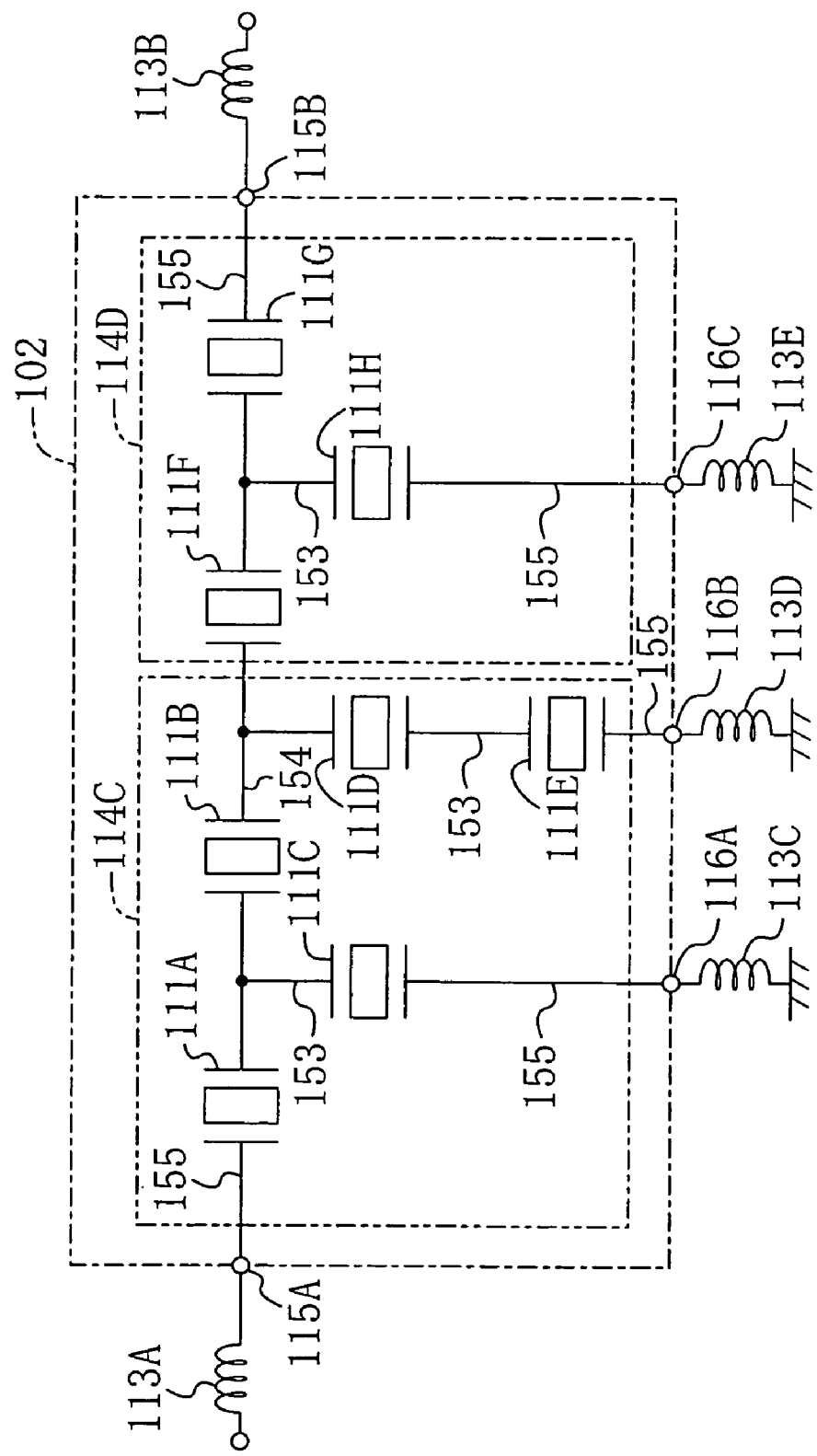
FIG. 8 is a circuit diagram showing a filter module according to a second embodiment of the present invention.

FIG. 8 shows a circuit configuration of a filter using a filter module according to a second embodiment. As shown in FIG. 8, a filter module 102 of this embodiment is formed by connecting units 114C and 114D of resonators in series to each other.

The unit 114C is composed of one serial element and two parallel elements. The serial element includes resonators 111A and 111B connected in series to input/output terminals 115A and 115B. The first parallel element includes a resonator 111C connected at one end between the resonators 111A and 111B and connected at the other end to a ground terminal 116A. The second parallel element includes a resonator 111D connected at one end to the side of the resonator 111B opposite to the resonator 111A and a resonator 111E connected at one end to the other end of the resonator 111D and grounded at the other end by a ground terminal 116B. The unit 114D has resonators 111F, 111G and 111H connected to have a T shape and has the same structure as the unit 114B of the first embodiment.

Figure 9:
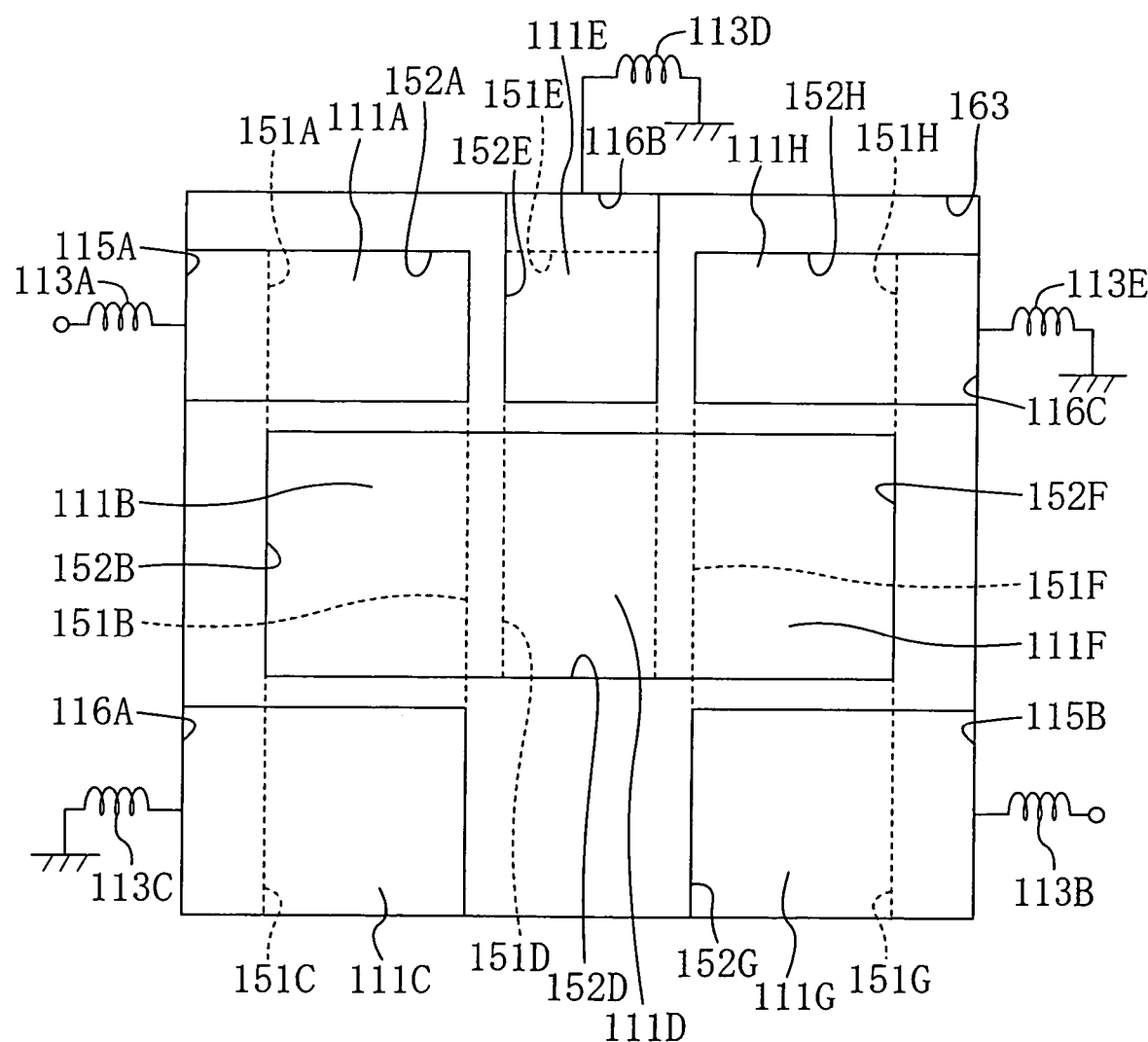
FIG. 9 is a top view showing the plan structure of the filter module according to the second embodiment of the present invention.

FIG. 9 shows an example of the plan structure of the filter module of this embodiment shown in the circuit diagram of FIG. 8. As shown in FIG. 9, the filter module of this embodiment is composed of eight resonators formed on a substrate. Out of the eight resonators, the resonators 111A, 111B, 111C, 111D, and 111E forming the unit 114A are electrically connected at their lower electrodes 151A, 151B, 151C, 151D, and 151E through interconnects 153 by forming the lower electrodes 151A, 151B, 151C, 151D, and 151E continuously with the interconnects 153. Furthermore, the resonators 111F, 111G and 111H forming the unit 114D are electrically connected at their lower electrodes 151F, 151G and 151H through interconnects 153 by forming the lower electrodes 151F, 151G and 151H continuously with the interconnects 153.

Furthermore, the resonators 111B, 111D and 111F are electrically connected at their upper electrodes 152B, 152D and 152F through interconnects 154 by forming the upper electrodes 152B, 152D and 152F continuously with the interconnects 154.

In this way, resonators in a filter module are connected at their upper or lower electrodes. No three-dimensional interconnect is formed to allow connection between the upper electrodes and the lower electrodes.

In the filter module of this embodiment, input/output terminals 115A and 115B and ground terminals 116A, 116B and 116C are formed as external connection terminals through which the filter module is connected to external circuits. These external connection terminals are all formed on the top surface of the piezoelectric layer 163.

The input/output terminals 115A and 115B are electrically connected through interconnects 155 to the upper electrodes 152A and 152G of the resonators 111A and 111G, respectively. The ground terminals 116A, 116B and 116C are electrically connected through interconnects 155 to the upper electrodes 152C, 152E and 152H of the resonators 111C, 111E and 111H, respectively. Therefore, all the interconnects through which external connection terminals are connected to the resonators are also planar, and no three-dimensional interconnect is formed.

In this embodiment, each of the combinations of the input/output terminal 115A and the upper electrode 152A, the input/output terminal 115B and the upper electrode 152G, the ground terminal 116A and the upper electrode 152C, the ground terminal 116B and the upper electrode 152E, and the ground terminal 116C and the upper electrode 152H is formed continuously.

In this way, also in the filter module of the present invention, resonators in the filter module are all electrically connected in the same plane. This eliminates the need for etching a piezoelectric layer to form three-dimensional interconnects, leading to the prevention of deterioration in the characteristics of resonators due to etching.

Furthermore, external connection terminals connected to external circuits are all formed on a piezoelectric layer and connected to upper electrodes. Therefore, lead electrodes need not be formed to provide external connection terminals. This eliminates the need for etching the piezoelectric layer to form lead electrodes, leading to the prevention of deterioration in the characteristics of resonators due to etching.

Moreover, since external connection terminals are all formed in the same plane, this eliminates the need for forming three-dimensional interconnects also in embedding a filter module into a device and can prevent high-frequency characteristics from being deteriorated in embedding the filter module into the device. In addition, the structure of the device can be simplified, leading to the reduced size of the device and the increased performance thereof.

Furthermore, in this embodiment, the second parallel element is a circuit in which two resonators are connected in series to each other. Therefore, when the structures of two resonators connected in series to each other are changed, this facilitates impedance matching. In addition, when the two resonators connected in series to each other are set to have slightly different resonance frequencies, an attenuation pole can be obtained at a desired frequency.

Modification of Embodiment 2

Figure 10:
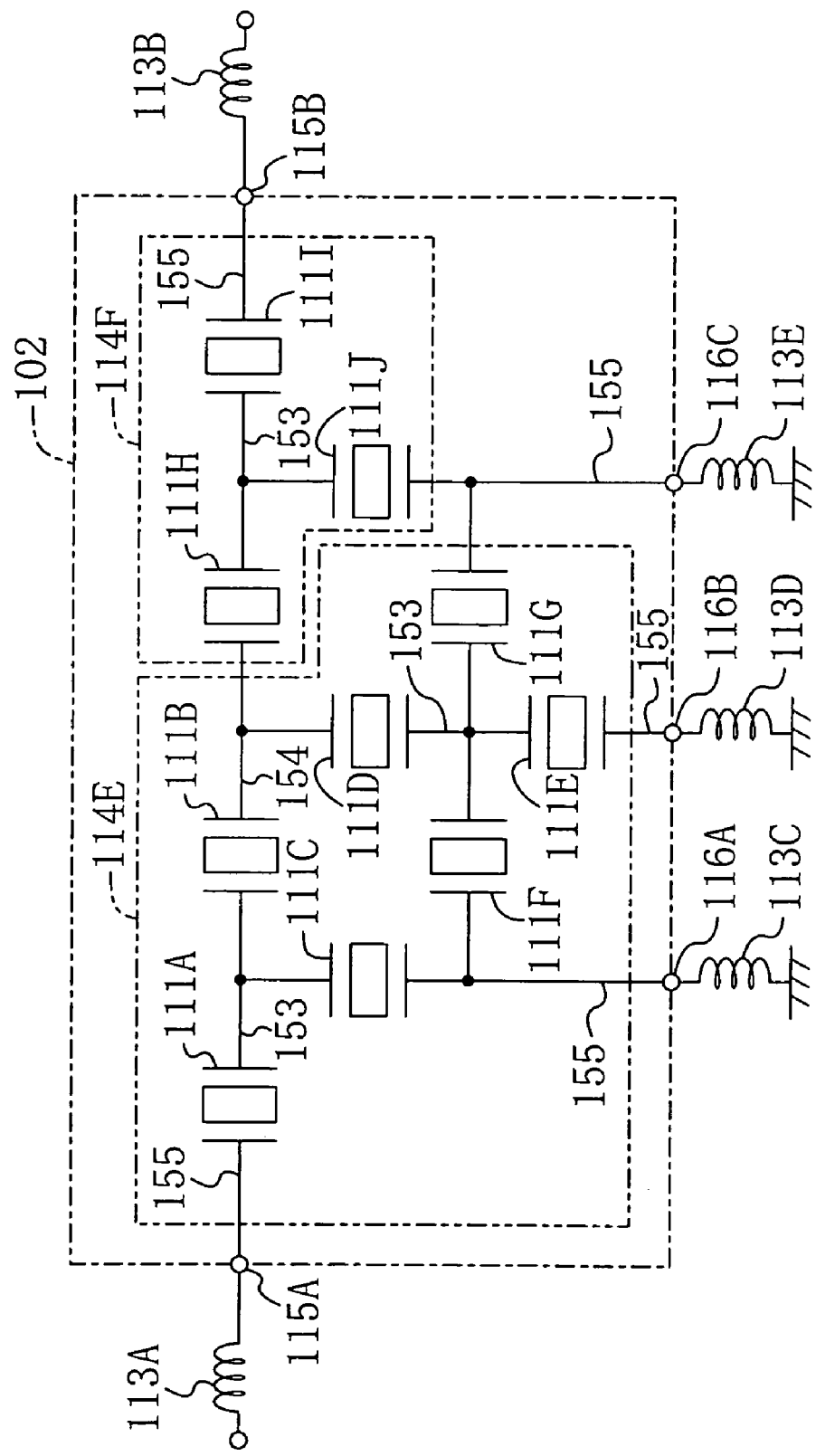
FIG. 10 is a circuit diagram showing a filter module according to a modification of the second embodiment of the present invention.

FIG. 10 shows a circuit configuration of a filter using a filter module according to a modification of the second embodiment. As shown in FIG. 10, a filter module 102 of this embodiment is formed in which units 114E and 114F of resonators are connected in series to each other. In the unit 114E, resonators 111F and 111G are connected in parallel to a resonator 111E.

Since resonators are thus connected in parallel to the resonator 111E forming part of a parallel element, this can reduce the impedance of resonators forming a parallel element and easily ensure the desired amount of attenuation at the attenuation pole.

Figure 11:
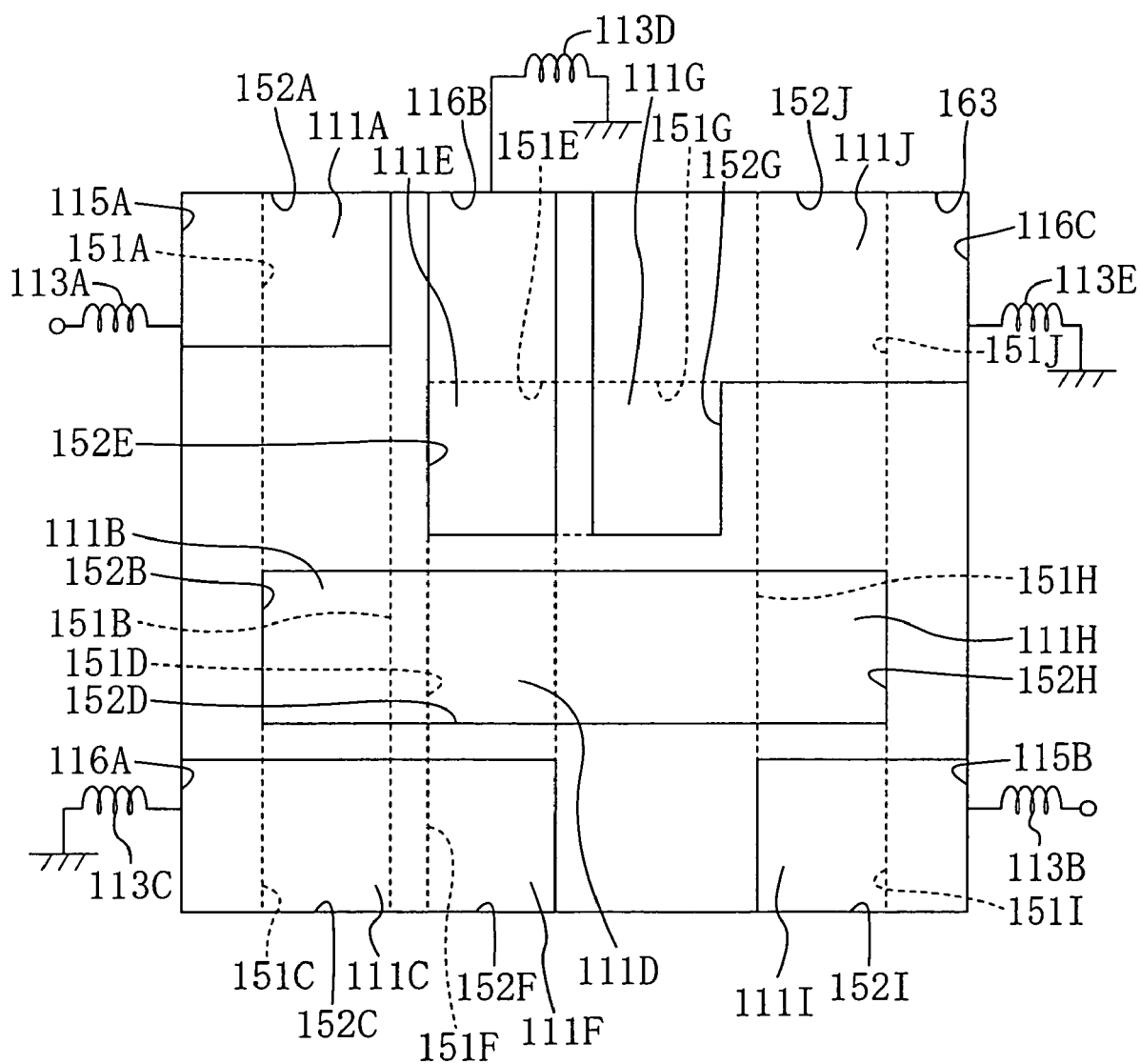
FIG. 11 is a top view showing the plan structure of the filter module according to the modification of the second embodiment of the present invention.

FIG. 11 shows an example of the plan structure of the circuit shown in FIG. 10 when the circuit is formed on a substrate. As shown in FIG. 11, even when the circuit has the structure as shown in FIG. 10, a piezoelectric layer need not be etched to form three-dimensional interconnects. In addition, external circuits can be connected to a filter module in the same plane of the piezoelectric layer.

Although in this embodiment two resonators are connected in parallel to the resonator 111E, one resonator or three or more resonators may be connected in parallel thereto. Furthermore, although the resonators 111F and 111G are grounded along with the resonators 111C and 111J, respectively, they may be grounded independently. Alternatively, both the resonators 111F and 111G may be grounded along with the resonator 111E.

Figure 12:
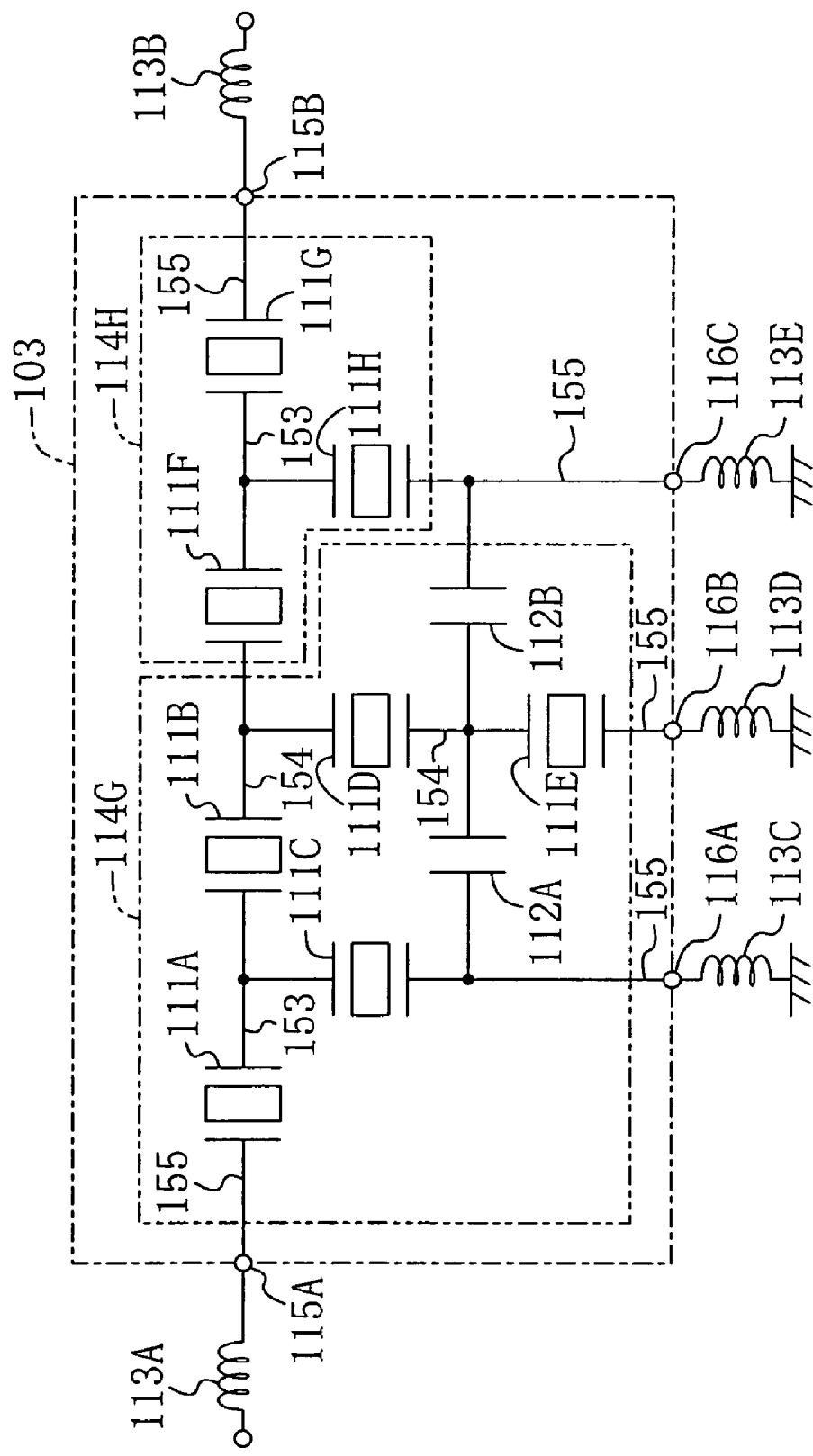
FIG. 12 is a circuit diagram showing another filter module according to the modification of the second embodiment of the present invention.

Furthermore, since piezoelectric effects do not contribute to, for example, impedance matching, capacitor elements 112A and 112B may be placed instead of resonators as shown in FIG. 12. In this case, capacitors can be obtained by forming resonators without forming, in the top surface of the substrate, cavities for ensuring longitudinal vibration.

Embodiment 3

A filter module according to a third embodiment and a method for fabricating the same will be described hereinafter with reference to the drawings. An equivalent circuit of the filter module of this embodiment is identical with that shown in FIG. 1, and the plan structure thereof is identical with that shown in FIG. 2. Although the formation of resonators 111B and 111D will be described below, resonators 111A, 111C, 111E, and 111F are also formed continuously on a substrate.

FIGS. 13A through 13F show cross sections showing process steps in a fabrication method for a filter module according to this embodiment step by step and taken along the line IIIa-IIIa in FIG. 2.

Figure 13A:
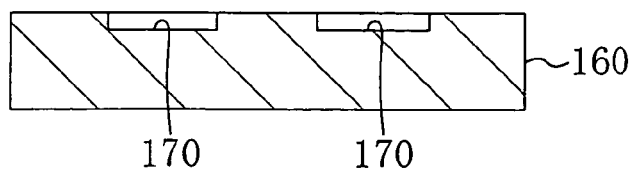
FIGS. 13A through 13F are cross-sectional views showing process steps in a method for fabricating a filter module according to a third embodiment of the present invention step by step.
Figure 13B:
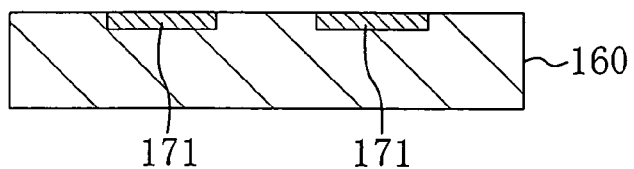

As shown in FIG. 13A, recesses 170 are formed by etching a substrate 160 of silicon. Subsequently, as shown in FIG. 13B, respective films of molybdenum and tungsten silicide are stacked in the recesses 170 in bottom-to-top order, thereby forming sacrificial layers 171.

Figure 13C:
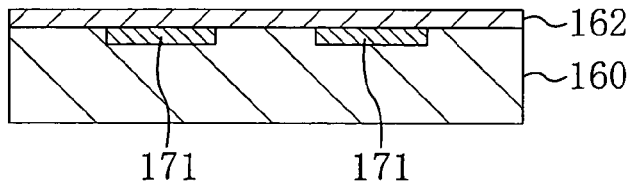

Next, as shown in FIG. 13C, an insulator layer 162 of silicon dioxide ($SiO_2$), trisilicon tetranitride ($Si_3N_4$) or any other material is entirely formed on the substrate 160 to cover the sacrificial layers 171. The insulator layer 162 may be omitted.

Figure 13D:
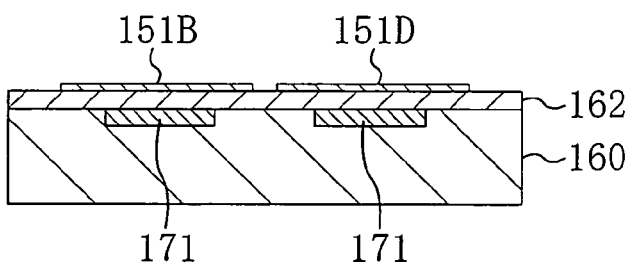

Next, as shown in FIG. 13D, a conductive film of gold (Au) is formed on the insulator layer 162, and then the formed conductive film is patterned into lower electrodes 151B and 151D. In this case, the lower electrode 151B is electrically connected to respective lower electrodes 151A and 151C of the resonators 111A and 111C, and the lower electrode 151D is electrically connected to respective lower electrodes 151E and 151F of the resonators 111E and 111F.

Figure 13E:
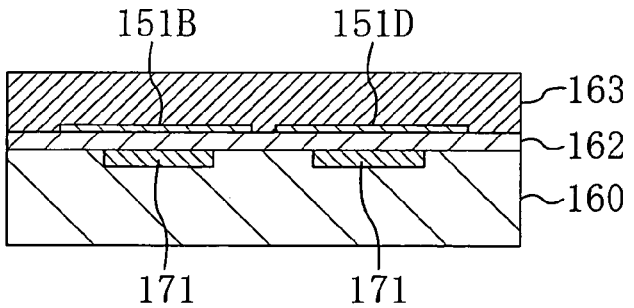
Figure 13F:
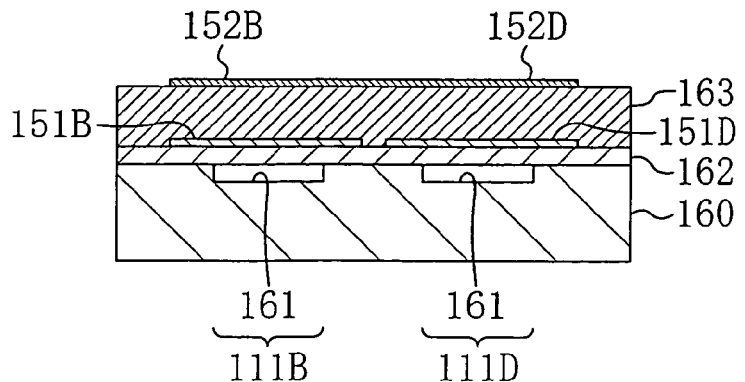

Next, as shown in FIG. 13E, a piezoelectric layer 163 of aluminum nitride (AlN) is entirely formed in a substrate 160 region by metal organic chemical vapor deposition (MOCVD) to cover the lower electrodes 151B and 151D. The MOCVD is carried out in a nitrogen atmosphere at a temperature of 1200° C. In this embodiment, high-melting materials are used for the sacrificial layers 171, the insulator layer 162 and the lower electrodes 151B and 151D. Therefore, even when a piezoelectric layer 163 is formed by MOCVD at a high temperature, any problem about a fabrication process is not caused.

Since a piezoelectric layer 163 can thus be formed by MOCVD to have excellent film quality, this can provide high-reliability resonators with excellent high-frequency characteristics. Therefore, a high-performance filter module can be fabricated.

Next, cavities 161 for ensuring longitudinal vibration along the thickness of the piezoelectric layer 163 are formed by removing the sacrificial layers 171 using etching.

In this embodiment, the sacrificial layers 171 each have a layered structure obtained by stacking a molybdenum film and a tungsten silicide film in bottom-to-top order. Therefore, for example, when aqueous hydrogen peroxide ($H_2O_2$) is used as a wet etchant, molybdenum is etched faster than tungsten silicide, because molybdenum has a higher etching rate than tungsten silicide. In view of the above, the molybdenum film, i.e., the lower layer of each sacrificial layer 171, is removed earlier than the tungsten silicide film, i.e., the upper layer of the sacrificial layer 171, so that aqueous hydrogen peroxide enters also below the tungsten silicide film. Since the tungsten silicide film, i.e., the upper layer of the sacrificial layer 171, is therefore transversely and longitudinally etched, this can shorten the time required for etching of the sacrificial layer 171.

Next, a conductive layer of, for example, gold (Au) is formed on the piezoelectric layer 163, and then the formed conductive layer is patterned into upper electrodes 152B and 152D such that the upper electrodes 152B and 152D are electrically connected to each other.

Resonators 111A, 111C, 111E, and 111F are simultaneously formed likewise, and six resonators are formed continuously on a substrate 160, thereby forming a filter having a circuit configuration shown in FIG. 1.

The conductive film formed on the piezoelectric layer 163 is patterned also into four external connection terminals, i.e., input/output terminals 115A and 115B and ground terminals 116A and 116B. In this case, the input/output terminals 115A and 115B and the ground terminals 116A and 116B are electrically connected to the upper electrodes 152A, 152E, 152C, and 152F of the resonators 111A, 111E, 111C, and 111F, respectively.

When a piezoelectric layer 163 is entirely formed in the substrate 160 region and shared by all the resonators formed on the substrate 160, resonators can be formed continuously on the substrate. This makes it easier that resonators have the same characteristics, leading to a filter module with excellent high-frequency characteristics.

Furthermore, in order to etch the sacrificial layers 171, via holes need be formed to pass through the piezoelectric layer 163. In this case, a protective layer may be formed on the piezoelectric layer 163 to protect the piezoelectric layer 163. Since such via holes are formed by etching only parts of the piezoelectric layer 163, this etching hardly damage the piezoelectric layer 163 unlike etching for forming lead electrodes.

When the insulator layer 162, the lower electrodes 151A through 151F, the piezoelectric layer 163, and the upper electrodes 152A through 152F are placed to partly expose the sacrificial layers 171, this eliminates the need for forming via holes to etch the sacrificial layers 171, resulting in the simplified process steps.

Although in this embodiment cavities 161 for ensuring longitudinal vibration along the thickness of the piezoelectric layer 163 each have a square opening, they may each have an opening of any shape, such as a polygon, a circle or an ellipse. Furthermore, each cavity 161 may be tapered.

Moreover, the cavities 161 may pass through the substrate 160. An insulator layer 162, lower electrodes 151A through 151F, a piezoelectric layer 163, and upper electrodes 152A through 152F are successively formed on the substrate 160 without forming recesses 170 in the top surface of the substrate 160, and finally via holes are formed from the back surface of the substrate 160 to reach the bottom of the insulator layer 162, thereby forming cavities 161. Also in this case, the same effects can be obtained.

Although in this embodiment recesses 170 are formed by etching the substrate 160, they may be formed by etching the insulator layer 162 formed on the substrate 160.

Although in this embodiment the sacrificial layers 171 have a layered structure of molybdenum and tungsten silicide, it may be made of at least any one of the other metals, dielectrics and insulators.

The sacrificial layers 171 may be planarized by chemical mechanical polishing (CMP) or any other process after the formation of the sacrificial layers 171. The planarization of the sacrificial layers 171 keeps the top and bottom surfaces of a filter module parallel to each other. This facilitates exciting longitudinal vibration along the thickness of the piezoelectric layer 163 at a desired frequency.

As described above, the fabrication method for a filter module of this embodiment has no step of forming three-dimensional interconnects and lead electrodes in which the piezoelectric layer must be etched. Therefore, the piezoelectric layer hardly needs to be etched. Since a filter module can thus be formed without damaging the piezoelectric layer, this can provide a filter module with excellent high-frequency characteristics.

In the fabricating method of a filter module of this embodiment, for example, a monocrystalline substrate of Si, a silicon substrate formed with an oxide film or the like can be used as an underlying substrate for a piezoelectric layer. When a substrate having high flatness and high crystallinity, such as a monocrystalline substrate of Si, is used, this can provide a high-quality piezoelectric layer. As a result, a filter module with excellent high-frequency characteristics can be obtained.

Although in this embodiment a piezoelectric layer is formed by MOCVD, a piezoelectric layer can be formed by sputtering. The use of sputtering permits the formation of a piezoelectric layer at a lower temperature of about 400 through 500° C. than the use of MOCVD. This provides such effects that the stress produced due to a difference in coefficients of thermal expansion between a substrate and the piezoelectric layer can be eased.

Although in this embodiment a description was given of the case where a filter having a circuit configuration shown in FIG. 1 is fabricated, filters having the other circuit configurations can also be fabricated likewise.

Embodiment 4

A filter module according to a fourth embodiment and a method for fabricating the same will be described hereinafter with reference to the drawings. The circuit configuration of the filter module of this embodiment is identical with that shown in FIG. 1, and the plan structure thereof is identical with that shown in FIG. 2. Although the formation of resonators 111B and 111D will be described below, resonators 111A, 111C, 111E, and 111F are also formed continuously on a substrate.

In this embodiment, a filter module including a plurality of resonators is formed by bonding a support substrate formed with recesses to a formation substrate on which a piezoelectric layer is formed.

Figure 14A:
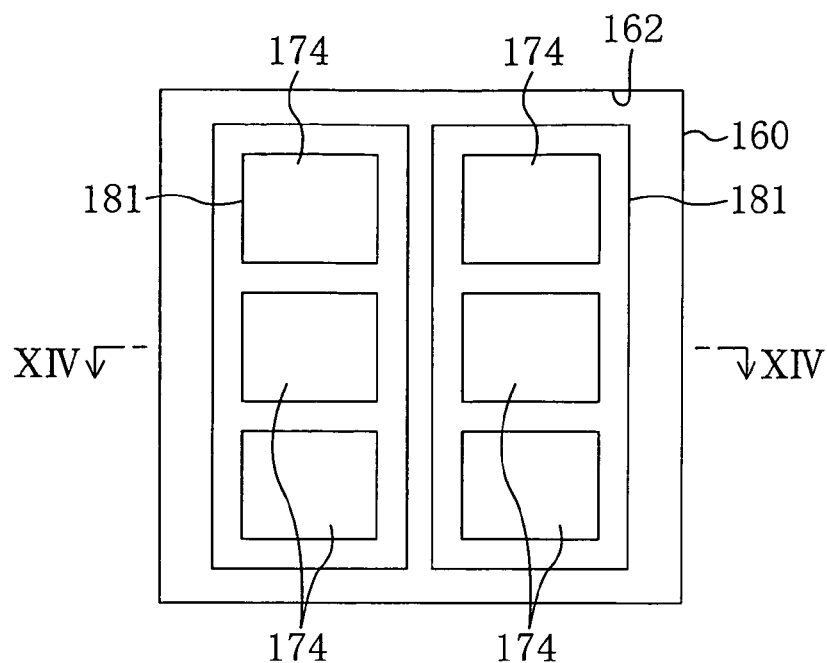
FIG. 14A is a top view showing the plan structure of holding members according to a fourth embodiment of the present invention.

FIGS. 14A through 14E show process steps for forming recesses in the support substrate. FIG. 14A shows the plan structure of the support substrate formed with recesses, and FIGS. 14B through 14E show cross sections of the support substrate taken along the line XIV-XIV in FIG. 14A step by step.

Figure 14B:
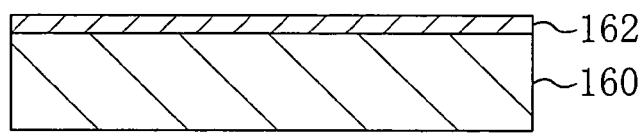
FIGS. 14B through 14E are cross-sectional views showing, out of process steps in a method for fabricating a filter module according to the fourth embodiment of the present invention, process steps for forming holding members step by step.
Figure 14C:
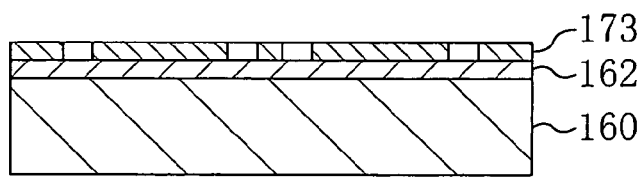
Figure 14D:
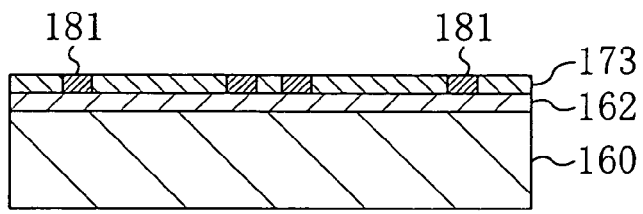
Figure 14E:
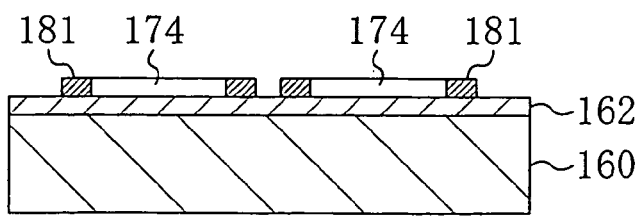

First, as shown in FIG. 14B, an insulator layer 162 of silicon dioxide ($SiO_2$), trisilicon tetranitride ($Si_3N_4$) or any other material is formed on a substrate 160 of silicon. Next, as shown in FIG. 14C, a grid-like mask pattern is formed on the insulator layer 162 by using a resist film 173. Subsequently, as shown in FIG. 14D, gold is evaporated using the mask pattern to be grid-shaped, and then the resist film 173 is removed, thereby forming recesses 174 surrounded by holding members 181 of gold as shown in FIG. 14E. As shown in FIG. 14A, the recesses 174 are formed to correspond to respective regions of the substrate 160 on which resonators are formed.

Figure 15A:
FIGS. 15A through 15C are cross-sectional views showing, out of the process steps in the method for fabricating a filter module according to the fourth embodiment of the present invention, process steps for forming a piezoelectric layer step by step.
Figure 15B:
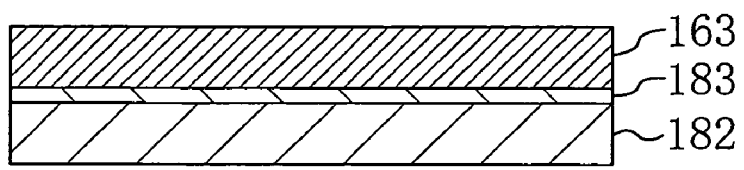
Figure 15C:
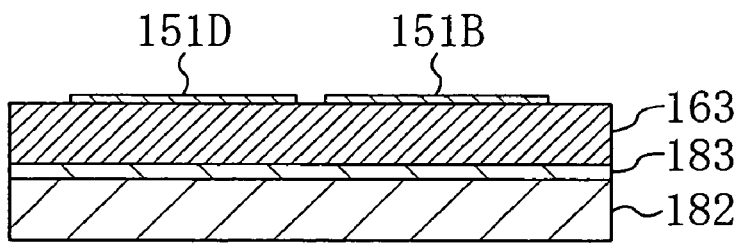

FIGS. 15A through 15C are cross-sectional views showing process steps for forming a piezoelectric layer on a formation substrate step by step. First, as shown in FIG. 15A, a buffer layer 183 of GaN is formed on a formation substrate 182 of sapphire. The buffer layer 183 is formed to separate the sapphire substrate 182 from the later-described piezoelectric layer after the later-described bonding step.

Next, as shown in FIG. 15B, a piezoelectric layer 163 of aluminum nitride (AlN) is formed on the buffer layer 183 by metal organic chemical vapor deposition (MOCVD). Thus, the use of MOCVD allows the formation of an excellent-quality piezoelectric layer. Therefore, broadband, high-quality-factor and high-reliability resonators can be fabricated. Furthermore, MOCVD is carried out at a high temperature of 1200° C. In this case, since GaN that is a high-melting material is used as a material of the buffer layer 183, the buffer layer 183 is sufficiently tolerant of a high temperature of 1200° C. Therefore, the use of MOCVD for the formation of a piezoelectric layer does not cause any problem about a fabrication process.

Next, as shown in FIG. 15C, a conductive layer of gold (Au) is formed on the piezoelectric layer 163, and then the formed conductive layer is patterned into lower electrodes 151B and 151D. In this case, the lower electrode 151B is formed continuously with respective lower electrodes 151A and 151C of resonators 111A and 111C so as to be electrically connected thereto, and the lower electrode 151D is formed continuously with respective lower electrodes 151E and 151F of resonators 111E and 111F so as to be electrically connected thereto.

Figure 16A:
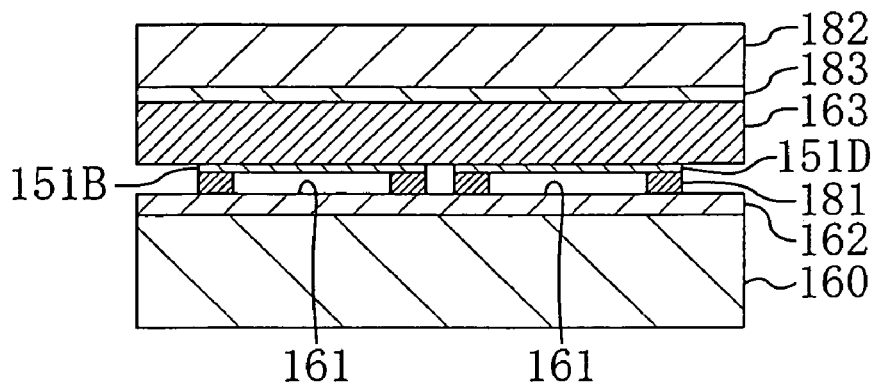
FIGS. 16A through 16C are cross-sectional views showing, out of the process steps in the method for fabricating a filter module according to the fourth embodiment, process steps for bonding the piezoelectric layer to the holding members step by step.
Figure 16B:
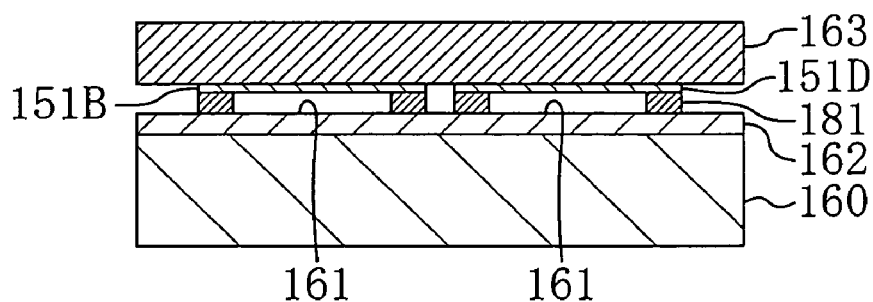
Figure 16C:
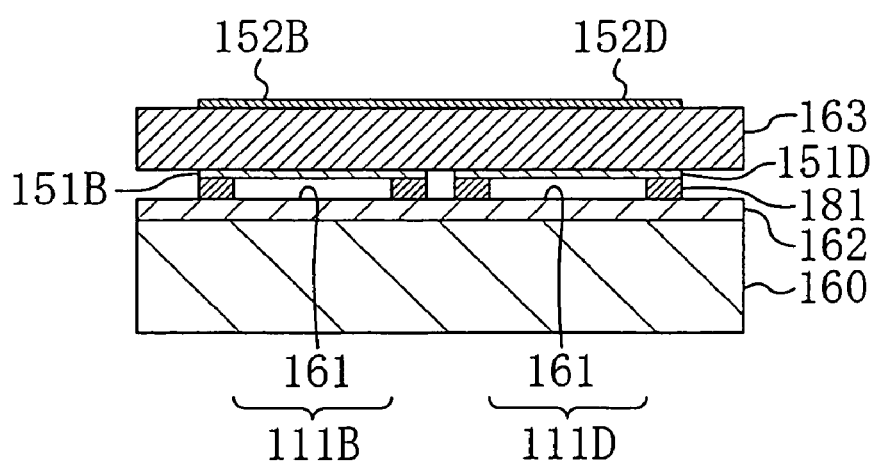

FIGS. 16A through 16C are cross-sectional views showing process steps for bonding a support substrate to a formation substrate step by step. First, as shown in FIG. 16A, a substrate 160 on which an insulator layer 162 and holding members 181 are formed is bonded to a formation substrate 182 on which a buffer layer 183, a piezoelectric layer 163, and lower electrodes 151B and 151D are formed. In this embodiment, gold is used for the holding members 181 and the lower electrodes 151B and 151D, and the two substrates are bonded to each other by applying a pressure of 1 $N/cm^2$ to the two opposed substrates at a temperature of 375° C. for ten minutes.

Next, as shown in FIG. 16B, the bonds among atoms forming the buffer layer 183 of GaN having a small band gap are cleaved by applying an yttrium-aluminum-garnet (YAG) laser to the back surface of the formation substrate 182 of sapphire, thereby separating the formation substrate 182 of sapphire from the piezoelectric layer 163. In this embodiment, the YAG laser is used for the separation of the formation substrate 182 from the piezoelectric layer 163. When the wavelength of the laser is determined in accordance with the thicknesses and types of the formation substrate 182 and the buffer layer 183 both used, the YAG laser is adaptable to the cases where the thickness of the buffer layer 183 varies, the band gap thereof varies, and any other material is selected as a material thereof.

Next, as shown in FIG. 16C, a conductive film of gold is formed on the piezoelectric layer 163, and then the formed conductive film is patterned into upper electrodes 152B and 152D such that the upper electrodes 152B and 152D are electrically connected to each other.

In the above-described process steps, the resonators 111A, 111C, 111E, and 111F are formed at the same time. In this way, six resonators having associated cavities 161 above the substrate 160 are formed continuously, thereby forming a filter having the circuit configuration shown in FIG. 1.

When the conductive film formed on the piezoelectric layer 163 is patterned, input/output terminals 115A and 115B and ground terminals 116A and 116B are also formed so as to be electrically connected to upper electrodes 152A, 152E, 152C, and 152F of the resonators 111A, 111E, 111C, and 111F, respectively.

As described above, according to the fabrication method for a filter module of this embodiment, since sacrificial layers are not used for the formation of cavities, this eliminates the need for removing the sacrificial layers by etching, and a plurality of resonators can be very easily formed which have associated cavities on a single substrate. Furthermore, since there is no process step of etching the piezoelectric layer, the piezoelectric layer is not deteriorated due to etching, resulting in a high-performance filter.

Although in this embodiment gold is used for the holding members 181 and the lower electrodes 151A through 151F, alloys, such as gold tin, may be used instead. Alternatively, the material of the holding members 181 may be different from that of the lower electrodes 151A through 151F. Furthermore, the holding members 181 may be made of an insulator of a resin material or any other material.

Although in this embodiment the holding members 181 are formed by depositing the conductive film on the insulator layer 162, holding members 181 may be formed by etching the insulator layer 162 or the substrate 160 itself.

If in the bonding between the substrate 160 and the formation substrate 182, the conditions, such as the temperature, the time and the stress, are changed in accordance with the materials of the holding members 181 and lower electrodes and the structure of the filter, this can further improve the reliability of a part of the filter in which the substrate 160 and the formation substrate 182 are bonded to each other.

Figure 17A:
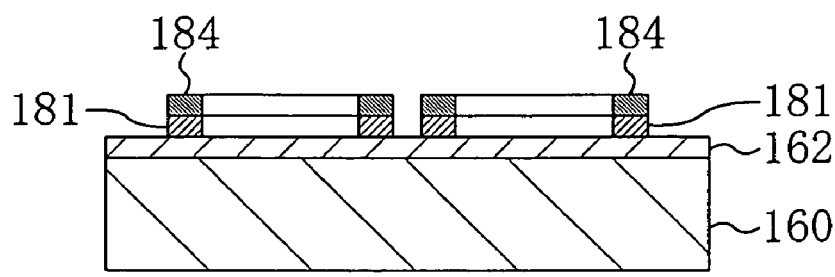
FIGS. 17A through 17C are cross-sectional views showing other process steps in the method for fabricating a filter module according to the fourth embodiment of the present invention step by step.
Figure 17B:
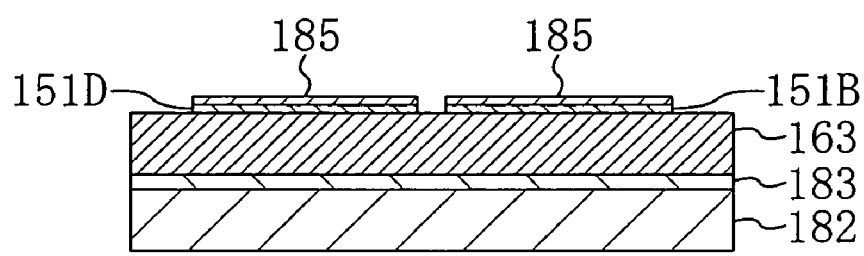
Figure 17C:
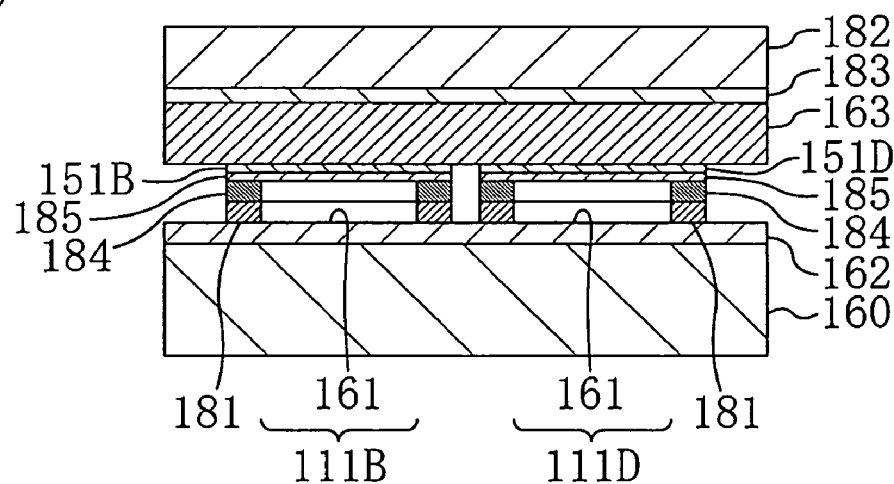

In this embodiment, when the substrate 160 and the formation substrate 182 are bonded to each other, the holding members 181 and the lower electrodes are directly bonded to each other. However, adhesive layers may be formed on at least either of the holding members 181 and lower electrodes. For example, as shown in FIG. 17A, first adhesive layers 184 of a gold-tin alloy are formed on holding members 181. As shown in FIG. 17B, second adhesive layers 185 of a gold-tin alloy are formed on lower electrodes. In this state, as shown in FIG. 17C, a substrate 160 and a formation substrate 182 are bonded to each other using gold-tin eutectic bonding by applying a pressure of 1 N/cm$^2$ to the two opposed substrates at a temperature of 375° C. for twenty minutes. The above-mentioned formation of the adhesive layers 184 and 185 allows the use of, as a material of the lower electrodes, aluminum with high conductivity or molybdenum with a high acoustic impedance.

Although in this embodiment sapphire is used for the formation substrate 182, a substrate of silicon, silicon carbide (SiC) or the like may be used as long as a piezoelectric layer 163 can be formed on the formation substrate 182. Although in this embodiment a layer of GaN is used as a material of the buffer layer 183, a material that can be easily separated from the formation substrate and on which a piezoelectric layer can be formed can be used. For example, if molybdenum is used as a material of the buffer layer, it can be easily separated from the formation substrate by aqueous hydrogen peroxide.

Furthermore, not only AlN formed by MOCVD, but also zinc oxide formed by high-temperature sputtering or lead titanate ($PbTiO_3$) or lead zirconate titanate (PbTiZrO), i.e., PZT, both subjected to heat treatment at a high temperature may be used for the piezoelectric layer 163. In this case, in order to form a film of such a material, the film must be subjected to a high-temperature process at approximately 800° C. under an oxygen atmosphere. Therefore, a heat-resistant material need be used as a material of a buffer layer.

Embodiment 5

A filter module according to a fifth embodiment will be described hereinafter with reference to the drawings. An equivalent circuit of the filter module of this embodiment is identical with that shown in FIG. 1, and the plan structure thereof is identical with that shown in FIG. 2.

Figure 18:
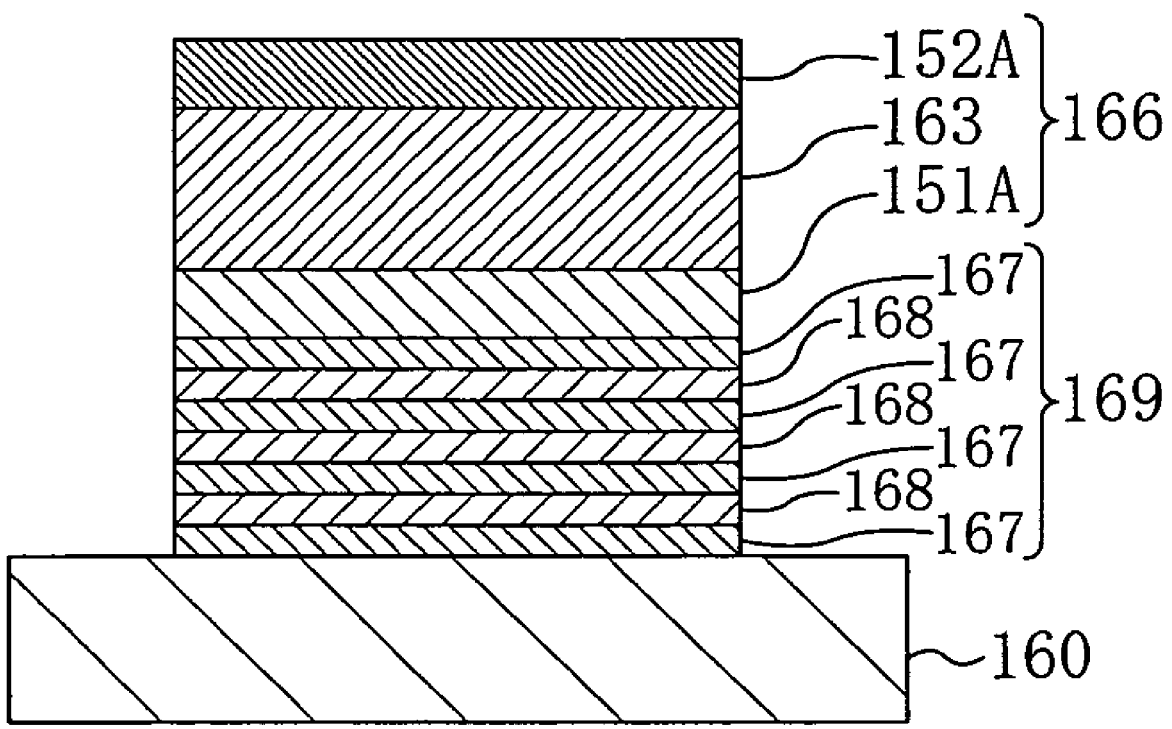
FIG. 18 is a cross-sectional view showing a resonator forming part of a filter module according to a fifth embodiment of the present invention.

FIG. 18 shows a resonator 111A taken from the filter module of this embodiment. As shown in FIG. 18, a vibration part 166 of the resonator 111A formed of a pair of upper and lower electrodes 152A and 151A and a piezoelectric layer 163 interposed therebetween is formed on an acoustic multilayer film 169. The acoustic multilayer film 169 is obtained by alternately stacking, on a substrate 160, low-impedance layers 167 having a thickness equivalent to one quarter of the wavelength of the intended resonance frequency and having a low acoustic impedance and high-impedance layers 168 having a high acoustic impedance. If the first layer of the acoustic multilayer film 169 when seen from the vibration part 166 side is the low-impedance layer 167, this can sufficiently reduce the load impedance applied to the piezoelectric layer 163, resulting in the piezoelectric layer 163 acoustically isolated from the substrate 160.

With such a structure, although the vibration part 166 is fixed on the substrate 160, the mode of the vibration part 166 approaches such a free vibration mode that nothing supports the vibration part 166. Therefore, the vibration part 166 can maintain elastic vibration. With the increased number of the stacked low-impedance layers 167 and high-impedance layers 168, the vibration part 166 is more significantly acoustically isolated from the substrate 160. However, if at least two low-impedance layers 167 and at least two high-impedance layers 168 are alternately stacked, this allows the vibration part 166 to be acoustically isolated from the substrate 160, resulting in such a structure functioning as a resonator.

Silicon dioxide ($SiO_2$); trisilicon tetranitride ($Si_3N_4$) or the like may be used for the low-impedance layers 167. Any one of aluminum nitride (AlN), zinc oxide (ZnO), molybdenum (Mo), hafnium dioxide ($HfO_2$), titanium dioxide ($TiO_2$), zirconium dioxide ($ZrO_2$), and the like may be used for the high-impedance layers 168.

A plurality of resonators having such a structure are formed on a substrate, and films are patterned into upper and lower electrodes to have a predetermined pattern, thereby obtaining a filter module.

As described above, according to the filter module of this embodiment, a cavity does not need to be formed in forming a resonator. This can achieve a high-reliability filter module.

Embodiment 6

Figure 19:
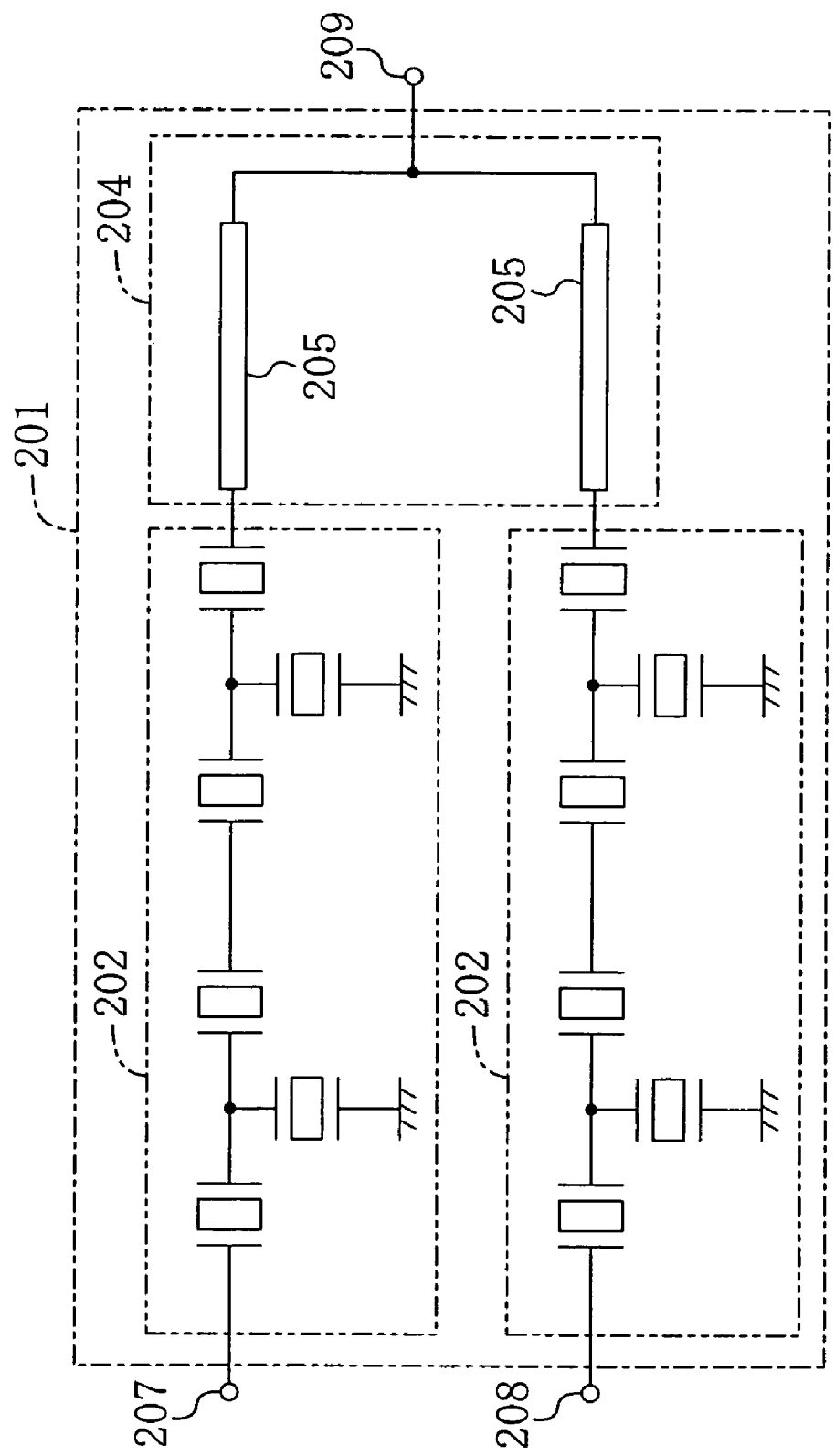
FIG. 19 is a block diagram showing a circuit configuration of a duplexer according to a sixth embodiment of the present invention.

A duplexer according to a sixth embodiment will be described hereinafter with reference to the drawings. FIG. 19 shows an equivalent circuit of a duplexer of this embodiment.

As shown in FIG. 19, a duplexer 201 of this embodiment is composed of a transmit filter (Tx filter) 202, a receive filter (Rx filter) 203 and a phase-shift circuit 204. Filter modules of the first embodiment are used as the Tx and Rx filters. The phase-shift circuit 204 is composed of, for example, two transmission lines 205. Furthermore, the Tx filter 202, the Rx filter 203 and the phase-shift circuit 204 are formed continuously on a circuit board of one silicon substrate.

Filter modules of the first embodiment are used for the duplexer of this embodiment. When the duplexer is continuously formed, all electrical interconnects through which the Tx filter 202, the Rx filter 203 and the phase-shift circuit 204 are connected can be formed in the same plane within a substrate region. Therefore, the interconnect pattern can be simplified, resulting in the reduced size of the duplexer. Furthermore, a process step of forming three-dimensional interconnects by etching is not required. This can prevent elements from being deteriorated due to etching, resulting in a low-loss duplexer.

Moreover, a Tx terminal 207, Rx terminal 208 and an antenna terminal 209 can be formed in the same plane within the substrate region, thereby simplifying process steps for embedding the duplexer into a device.

Although in this embodiment filter modules of the first embodiment are used as the Tx filter 202 and the Rx filter 203, the filter modules of the present invention including the filter module of the second embodiment can be used likewise.

Embodiment 7

Figure 20:
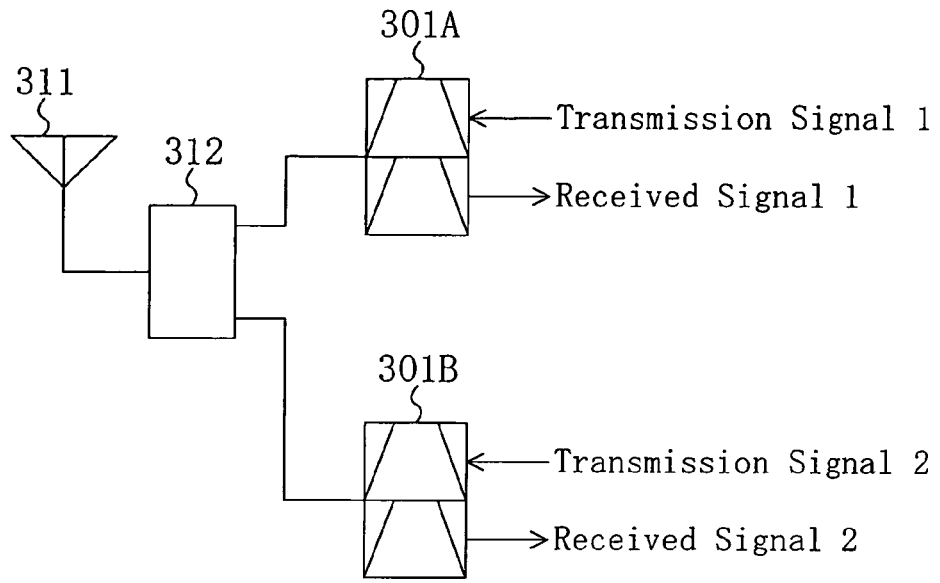
FIG. 20 is a block diagram showing a communication device according to a seventh embodiment of the present invention.

A communication device according to a seventh embodiment will be described hereinafter with reference to the drawings. FIG. 20 shows the configuration of a communication device of this embodiment.

As shown in FIG. 20, the communication device according to the seventh embodiment is composed of an antenna 311, a branching filter 312, and duplexers 301A and 301B. The duplexer of the sixth embodiment is used as at least one of the duplexers 301A and 301B. The branching filter 312 is used to separate two frequency signals from each other.

Low-loss duplexers of the sixth embodiment having input/output terminals in the same plane within a substrate region are used for the communication device of this embodiment. This can simplify the interconnect pattern in embedding duplexers into a communication device and achieve a low-loss and small communication device. Furthermore, process steps for embedding duplexers into a communication device can also be simplified.

Embodiment 8

Figure 21:
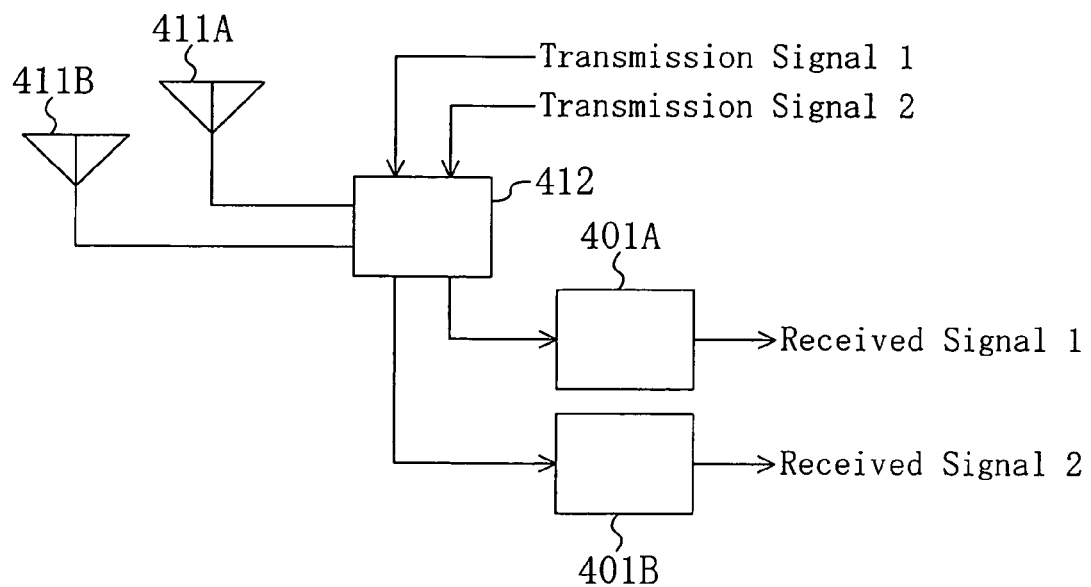
FIG. 21 is a block diagram showing a communication device according to an eighth embodiment of the present invention.

A communication device according to an eighth embodiment will be described hereinafter with reference to the drawings. FIG. 21 shows the configuration of a communication device of this embodiment.

As shown in FIG. 21, the communication device of the eighth embodiment is composed of two antennas 411A and 411B, a switch 412, and two filters 401A and 401B. Filters of the first embodiment are used as the filters 401A and 401B. Filters shown in the other embodiments may be used instead.

Such a configuration can also simplify the interconnect pattern in embedding filters into a communication device and achieve a low-loss and small communication device. Furthermore, process steps for embedding filters into a communication device can be simplified.

As described above, according to the present invention, a high-performance and small filter using piezoelectric resonators utilizing longitudinal vibration along the thickness of a piezoelectric material can be provided which does not have any three-dimensional interconnect therein and can be easily embedded into a device because of the existence of all external connection terminals in the same plane. Therefore, the filter module using the piezoelectric resonators of the present invention is useful, in particular, as a filter module used for a high-frequency circuit of a mobile communication terminal, such as a cellular phone and a wireless LAN, and formed continuously on a substrate.

What is claimed is:

1. A filter module comprising:
   a substrate;
   a plurality of resonators formed on the substrate, having a piezoelectric layer supported on the substrate to spread over the principal surface of the substrate and utilizing longitudinal vibration along the thickness of the piezoelectric layer;
   a plurality of external connection terminals formed above or below the piezoelectric layer so as to be electrically connected to external circuits;
   a plurality of first interconnects formed to the side of the piezoelectric layer to which the external connection terminals are formed to electrically connect the external connection terminals to associated ones of the plurality of resonators; and
   a plurality of second interconnects through each of which predetermined resonators out of the plurality of resonators are electrically connected to each other, wherein:
   each of said plurality of resonators comprises a pair of electrodes consisting of lower and upper electrodes formed on the back and top surfaces of the piezoelectric layer, respectively,
   each said first interconnect is electrically connected to one of the associated upper and lower electrodes formed on the surface of the piezoelectric layer on which the associated external connection terminal is formed,
   each said second interconnect is used to electrically connect the associated pair of lower electrodes to each other or to electrically connect the associated pair of upper electrodes to each other,
   the external connection terminals include two input/output terminals through which signals are input/output to/from the filter module,
   at least one resonator unit is connected between the input/output terminals,
   said at least one resonator unit comprises a serial element including at least one of the plurality of resonators electrically connected in series between the input/output terminals and at least one parallel element including at least one of the plurality of resonators electrically connected between the input/output terminals and the ground, said plurality of resonators includes a first resonator, a second resonator, a third resonator, a fourth resonator, a fifth resonator and a sixth resonators, the serial element represents the first and second resonators electrically connected in series to each other, the at least one parallel element includes a parallel element connected between at least one of both ends of the serial element and the ground and a parallel element connected between a node at which the first and second resonators are connected to each other and the ground, the parallel element connected to the node represents the third resonator, the parallel element connected to at least one of the both ends of the serial element represents the fourth and fifth resonators, the fourth and fifth resonators being connected in series from the input/output terminal, and the parallel element connected to at least one of the both ends of the serial element includes the sixth resonators connected in parallel to the fifth resonator.

2. The filter module of claim 1, wherein
a cavity is formed under each said lower electrode.

3. The filter module of claim 1, wherein
an acoustic multilayer film is formed under each said lower electrode, the acoustic multilayer film is obtained by alternately stacking at least two first thin layers and at least two second thin layers having a higher acoustic impedance than the first thin layer, and the uppermost layer of the acoustic multilayer film is the first thin layer.

4. The filter module of claim 1, wherein
the plurality of external connection terminals are formed above the piezoelectric layer.

5. The filter module of claim 1, wherein
the plurality of external connection terminals are formed below the piezoelectric layer.

6. The filter module of claim 1, wherein
the piezoelectric layer represents a film formed on a film formation substrate and bonded onto the substrate.

7. A filter module comprising:

a substrate;

a plurality of resonators formed on the substrate, having a piezoelectric layer supported on the substrate to spread over the principal surface of the substrate and utilizing longitudinal vibration along the thickness of the piezoelectric layer;

a plurality of external connection terminals formed above or below the piezoelectric layer so as to be electrically connected to external circuits;

a plurality of first interconnects formed to the side of the piezoelectric layer to which the external connection terminals are formed to electrically connect the external connection terminals to associated ones of the plurality of resonators; and a plurality of second interconnects through each of which predetermined resonators out of the plurality of resonators are electrically connected to each other, wherein:

each of said plurality of resonators comprises a pair of electrodes consisting of lower and upper electrodes formed on the back and top surfaces of the piezoelectric layer, respectively, each said first interconnect is electrically connected to one of the associated upper and lower electrodes formed on the surface of the piezoelectric layer on which the associated external connection terminal is formed, each said second interconnect is used to electrically connect the associated pair of lower electrodes to each other or to electrically connect the associated pair of upper electrodes to each other, the external connection terminals include two input/output terminals through which signals are input/output to/from the filter module, at least one resonator unit is connected between the input/output terminals, said at least one resonator unit comprises a serial element including at least one of the plurality of resonators electrically connected in series between the input/output terminals and at least one parallel element including at least one of the plurality of resonators electrically connected between the input/output terminals and the ground, said plurality of resonators includes a first resonator, a second resonator, a third resonator, a fourth resonator and a fifth resonator, the serial element represents the first and second resonators electrically connected in series to each other, the at least one parallel element includes a parallel element connected between at least one of both ends of the serial element and the ground and a parallel element connected between a node at which the first and second resonators are connected to each end the ground, the parallel element connected to the node represents the third resonator, the parallel element connected to at least one of the both ends of the serial element represents the fourth and fifth resonators, the fourth and fifth resonators being connected in series from the input/output terminal, and the parallel element connected to at least one of the both ends of the serial element includes one or more capacitor elements connected in parallel to the fifth resonator.

8. The filter module of claim 7, wherein
the capacitor elements are formed using predetermined regions of the piezoelectric layer as capacitive insulating films.

9. A duplexer comprising a first filter, a second filter and a phase-shift circuit, wherein the first and second filters comprises a filter module comprising:

a substrate;

a plurality of resonators formed on the substrate and having a piezoelectric layer supported on the substrate to spread over the principal surface of the substrate and utilizing longitudinal vibration along the thickness of the piezoelectric layer;

a plurality of external connection terminals formed above or below the piezoelectric layer so as to be electrically connected to external circuits;

a plurality of first interconnects formed to the side of the piezoelectric layer to which the external connection terminals are formed to electrically connect the external connection terminals to associated ones of the plurality of resonators; and a plurality of second interconnects through each of which predetermined resonators out of the plurality of resonators are electrically connected to each other, wherein:

each of said plurality of resonators comprises a pair of electrodes consisting of lower and upper electrodes formed on the back and top surfaces of the piezoelectric layer, respectively, each said first interconnect is electrically connected to one of the associated upper and lower electrodes formed on the surface of the piezoelectric layer on which the associated external connection terminal is formed, each said second interconnect is used to electrically connect the associated pair of lower electrodes to each other or to electrically connect the associated pair of upper electrodes to each other, the external connection terminals include two input/output terminals through which signals are input/output to/from the filter module, at least one resonator unit is connected between the input/output terminals, said at least one resonator unit comprises a serial element including at least one of the plurality of resonators electrically connected in series between the input/output terminals and at least one parallel element including at least one of the plurality of resonators electrically connected between the input/output terminals and the ground, said plurality of resonators includes a first resonator, a second resonator, a third resonator, a fourth resonator, a fifth resonator and a sixth resonators, the serial element represents the first and second resonators electrically connected in series to each other, the at least one parallel element includes a parallel clement connected between at least one of both ends of the serial element and the ground and a parallel element connected between a node at which the first and second resonators are connected to each other and the ground, the parallel element connected to the node represents the third resonator, the parallel element connected to at least one of the both ends of the serial element represents the fourth and fifth resonators, the fourth and fifth resonators being connected in series from the input/output terminal, and the parallel element connected to at least one of the both ends of the serial element includes the sixth resonators connected in parallel to the fifth resonator.

10. A communication device comprising a filter module, wherein the filter module comprises:

a substrate;

a plurality of resonators formed on the substrate and having a piezoelectric layer supported on the substrate to spread over the principal surface of the substrate and utilizing longitudinal vibration along the thickness of the piezoelectric layer;

a plurality of external connection terminals formed above or below the piezoelectric layer so as to be electrically connected to external circuits;

a plurality of first interconnects formed to the side of the piezoelectric layer to which the external connection terminals are formed to electrically connect the external connection terminals to associated ones of the plurality of resonators; and a plurality of second interconnects through each of which predetermined resonators out of the plurality of resonators are electrically connected to each other, wherein:

each of said plurality of resonators comprises a pair of electrodes consisting of lower and upper electrodes formed on the back and top surfaces of the piezoelectric layer, respectively, each said first interconnect is electrically connected to one of the associated upper and lower electrodes formed on the surface of the piezoelectric layer on which the associated external connection terminal is formed, each said second interconnect is used to electrically connect the associated pair of lower electrodes to each other or to electrically connect the associated pair of upper electrodes to each other, the external connection terminals include two input/output terminals through which signals are input/output to/from the filter module, at least one resonator unit is connected between the input/output terminals, said at least one resonator unit comprises a serial element including at least one of the plurality of resonators electrically connected in series between the input/output terminals and at least one parallel element including at least one of the plurality of resonators electrically connected between the input/output terminals and the ground, said plurality of resonators includes a first resonator, a second resonator, a third resonator, a fourth resonator, a fifth resonator and a sixth resonators, the serial element represents the first and second resonators electrically connected in series to each other, the at least one parallel element includes a parallel element connected between at least one of both ends of the serial element and the ground and a parallel element connected between a node at which the first and second resonators are connected to each other and the ground, the parallel element connected to the node represents the third resonator, the parallel element connected to at least one of the both ends of the serial element represents the fourth and fifth resonators, the fourth and fifth resonators being connected in series from the input/output terminal, and the parallel element connected to at least one of the both ends of the serial element includes the sixth resonators connected in parallel to the fifth resonator.

11. A communication device comprising a duplexer comprising a first filter, a second filter and a phase-shift circuit, wherein the first and second filters comprises a filter module comprising:

a substrate;

a plurality of resonators formed on the substrate and having a piezoelectric layer supported on the substrate to spread over the principal surface of the substrate and utilizing longitudinal vibration along the thickness of the piezoelectric layer;

a plurality of external connection terminals formed above or below the piezoelectric layer so as to be electrically connected to external circuits;

a plurality of first interconnects formed to the side of the piezoelectric layer to which the external connection terminals are formed to electrically connect the external connection terminals to associated ones of the plurality of resonators; and a plurality of second interconnects through each of which predetermined resonators out of the plurality of resonators are electrically connected to each other, wherein:

each of said plurality of resonators comprises a pair of electrodes consisting of lower and upper electrodes formed on the back and top surfaces of the piezoelectric layer, respectively, each said first interconnect is electrically connected to one of the associated upper and lower electrodes formed on the surface of the piezoelectric layer on which the associated external connection terminal is formed, each said second interconnect is used to electrically connect the associated pair of lower electrodes to each other or to electrically connect the associated pair of upper electrodes to each other, the external connection terminals include two input/output terminals through which signals are input/output to/from the filter module, at least one resonator unit is connected between the input/output terminals, said at least one resonator unit comprises a serial element including at least one of the plurality of resonators electrically connected in series between the input/output terminals and at least one parallel element including at least one of the plurality of resonators electrically connected between the input/output terminals and the ground, said plurality of resonators includes a first resonator, a second resonator, a third resonator, a fourth resonator, a fifth resonator and a sixth resonators, the serial element represents the first and second resonators electrically connected in series to each other, the at least one parallel element includes a parallel element connected between at least one of both ends of the serial element and the ground and a parallel element connected between a node at which the first and second resonators are connected to each other and the ground, the parallel element connected to the node represents the third resonator, the parallel element connected to at least one of the both ends of the serial element represents the fourth and fifth resonators, the fourth and fifth resonators being connected in series from the input/output terminal, and the parallel clement connected to at least one of the both ends of the serial element includes the sixth resonators connected in parallel to the fifth resonator.

* * * * *